(12) United States Patent
Niles et al.

(10) Patent No.: US 11,650,225 B2
(45) Date of Patent: *May 16, 2023

(54) TEST AND MEASUREMENT DEVICES, SYSTEMS AND METHODS ASSOCIATED WITH AUGMENTED REALITY

(71) Applicant: Tektronix, Inc., Beaverton, OR (US)

(72) Inventors: Tyler B. Niles, Beaverton, OR (US); Daniel G. Knierim, Beaverton, OR (US); Michael J. Wadzita, Vancouver, WA (US); Joshua J. O'Brien, Aloha, OR (US); David Everett Burgess, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/539,160

(22) Filed: Nov. 30, 2021

(65) Prior Publication Data

US 2022/0196701 A1 Jun. 23, 2022

Related U.S. Application Data

(63) Continuation of application No. 16/622,847, filed as application No. PCT/US2018/038093 on Jun. 18, 2018, now Pat. No. 11,187,720.

(60) Provisional application No. 62/520,755, filed on Jun. 16, 2017, provisional application No. 62/520,882, filed on Jun. 16, 2017.

(51) Int. Cl.
*G01R 1/02* (2006.01)
*G01R 13/02* (2006.01)

(52) U.S. Cl.
CPC ......... *G01R 1/025* (2013.01); *G01R 13/0218* (2013.01)

(58) Field of Classification Search
CPC .. G01R 1/025; G01R 13/0218; G01R 13/408; G01R 13/02
USPC ............... 324/76.24, 76.19, 76.12, 76.11
See application file for complete search history.

(56) References Cited

U.S. PATENT DOCUMENTS

| 3,246,104 | A | * | 4/1966 | Shockroo | H01H 61/02 337/109 |
| 3,418,531 | A | * | 12/1968 | Strachan | G03B 21/16 361/106 |
| 5,430,292 | A | * | 7/1995 | Honjo | H01J 37/3005 250/397 |
| 10,664,975 | B2 | | 5/2020 | Aonuma et al. | |

(Continued)

FOREIGN PATENT DOCUMENTS

| EP | 1203962 | 5/2002 |
| JP | 2002-303640 | 10/2002 |

(Continued)

*Primary Examiner* — Giovanni Astacio-Oquendo
(74) *Attorney, Agent, or Firm* — Miller Nash LLP; Andrew J. Harrington

(57) ABSTRACT

A test and measurement system can include a data store configured to store augmentation settings for dynamically augmenting a physical testing environment and a computing device coupled to the data store. The computing device can be configured to receive an input feed from the physical testing environment, create an augmentation image based on the augmentation settings and the input feed, and output the augmented image to be overlaid on the physical testing environment to augment a user's view of the physical testing environment.

20 Claims, 38 Drawing Sheets

(56) References Cited

U.S. PATENT DOCUMENTS

| | | |
|---|---|---|
| 11,176,681 B2 | 11/2021 | Aonuma et al. |
| 2005/0174361 A1 | 8/2005 | Kobayashi et al. |
| 2006/0076503 A1* | 4/2006 | Tsao .................. H01L 21/76892 |
| | | 250/397 |
| 2006/0273263 A1* | 12/2006 | Raymond .............. G01B 11/24 |
| | | 250/492.2 |
| 2014/0045648 A1* | 2/2014 | Bangura ............... F02N 11/006 |
| | | 477/3 |
| 2018/0168728 A1 | 6/2018 | Coluccia |

FOREIGN PATENT DOCUMENTS

| | | |
|---|---|---|
| JP | 2005-227876 | 8/2005 |
| JP | 2014-123193 | 7/2014 |
| JP | 2015-119236 | 6/2015 |
| JP | 2016-099638 | 5/2016 |

* cited by examiner

TEST AND MEASUREMENT DEVICES, SYSTEMS AND METHODS ASSOCIATED WITH AUGMENTED REALITY

CROSS-REFERENCE TO RELATED APPLICATION

This application is a continuation of U.S. patent application Ser. No. 16/622,847, filed Dec. 13, 2019, which claims the benefit of U.S. Provisional Application Ser. No. 62/520,755, titled "TEST AND MEASUREMENT DEVICES, SYSTEMS AND METHODS ASSOCIATED WITH AUGMENTED REALITY" and 62/520,882, titled "GESTURE BASED INTERFACE FOR INSTRUMENT CONTROL," both filed on Jun. 16, 2017. The content of each of these applications is hereby fully incorporated by reference herein.

TECHNICAL FIELD

Embodiments of the disclosed technology generally relate to electrical test and measurement instrumentation, and in particular, to the implementation of virtual reality and/or augmented reality therewith.

BACKGROUND

Electrical test and measurement environments are dealing with increasingly complex signals that are pushing the boundaries of test measurement equipment's abilities to display corresponding waveforms in a manner that is intuitive to an end user. Similarly, the complexity of both the design and physical implementation of various devices under test (DUTs) are also increasing. This increased complexity of DUTs results in corresponding increases in complexity of the performing of many tasks that may be required of a user of a test and measurement environment in analyzing the DUTs.

For example, a user of a test and measurement environment may need to identify signal acquisition regions on a design of a DUT that can enable one or more signals of interest to be acquired from the DUT. This may be accomplished, for example, by analyzing a design of the DUT, such as a schematic diagram of the DUT, to identify regions or points in the design at which the one or more signals of interest can be acquired. The user may then need to physically locate probing points associated with the signal acquisition regions on the DUT itself to enable the one or more signals of interest to be sampled from the DUT.

This can be accomplished, for example, by applying one or more probes to a corresponding number of probing points that enable the probe to sample the one or more signals of interest. Once the probes have been applied, the user may then view the signals on a display of the test and measurement instrument. However, because of the increasing complexity of the designs of the DUTs, the physical implementations of the DUTs, and the signals produced by the DUTs, each of these tasks continues to be increasingly more difficult and more time consuming to be performed.

Also, it can be difficult for customers to determine whether a particular contact is an acceptable location to connect a ground clip or wire (e.g., typically from a probe), as connecting a ground to an unacceptable location can damage the DUT and potentially become hazardous for the operator or equipment.

Thus, there remains a need for improved devices, systems and methods for user experience with electrical test and measurement equipment.

DETAILED DESCRIPTION

Figure 1:
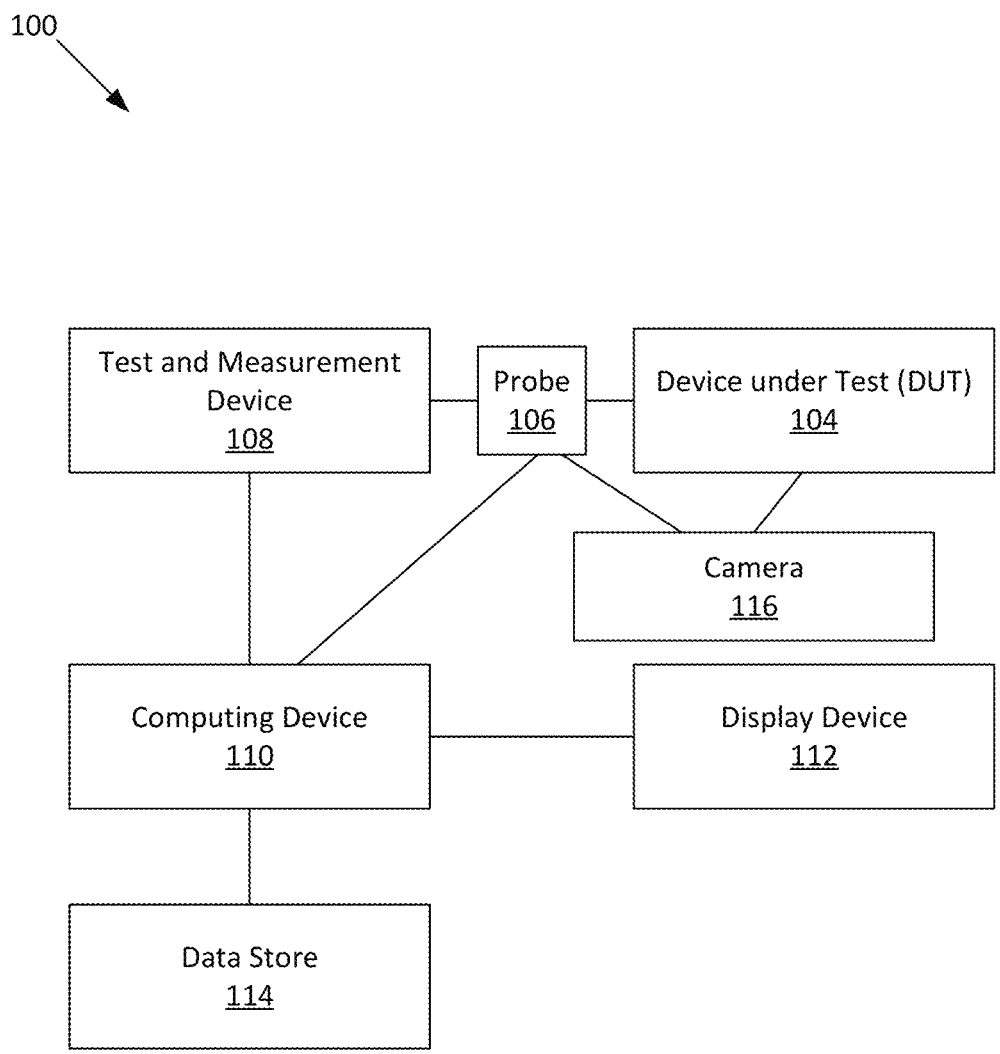
FIG. 1 is a block diagram illustrating an example of an electronic test and measurement environment having an augmented reality system incorporated therewith in accordance with certain implementations of the disclosed technology.

Embodiments of the disclosed technology are generally directed to an augmented reality system that is configurable to be incorporated with an electrical test and measurement environment to enable a user to experience being visually immersed within the electrical test and measurement environment. As described in greater detail below, the visual immersion of the user within the test and measurement environment can enable more efficient transitions between tasks that the user is performing.

In addition, the system can present the user with information and guidance that simply was not possible prior to the augmented reality embodiments described herein. The visual immersion of the user into the test and measurement environment can also enable the user to interact with signals, waveforms, and various other types of information and data in new and unique ways.

This visual immersion can be accomplished by way of the overlaying of virtual and/or augmented content on an image, or video feed, of a physical environment. In some configurations, the image, or video feed, of the physical environment can be captured by one or more cameras within the physical environment, e.g., located on a head-mounted display (HMD), tablet, etc. In other configurations, the virtual and/or augmented reality system can be configured to overlay the virtual and/or augmented content onto a transparent display that enables the user to directly view the physical environment with the virtual/augmented image integrated therewith.

In either configuration, a location of the virtual/augmented content within the physical environment can be determined, for example, based on one or more markers, or other physical indicia, placed within the physical environment. Such markers could include aspects of the DUT itself (e.g., a ball-grid array, probing points, etc.), probes or aspects thereof, pointers within the physical environment (e.g., hands, stylus, etc.), or any other suitable artifact within the physical environment that can be utilized to identify a location at which to place the virtual/augmented content or initiate generation of the virtual/augmented content.

It will be appreciated that the virtual/augmented content could also be placed according to a pre-determined position within the display (e.g., determined by pixel coordinates) or the environment. Such a pre-determined position can be automatically selected or set/changed by a user, for example. It will be appreciated that such features are not limited based on the mechanism utilized to determine location of virtual content. It will also be appreciated that any marker or markerless-based virtual and/or augmented reality mechanisms, or any combination thereof, can be utilized in determining when and/or where to display various virtual/augmented content.

In various configurations, an orientation (e.g., perspective) of the virtual/augmented content can be updated to reflect movement of the user or the augmented reality system within the physical environment. For example, a user can view a waveform, or measurement thereof, in three-dimensional space. In such an example, the augmented reality system can enable the user to move around the three-dimensional space to view the waveform, or measurement thereof, from different perspectives.

In alternative, or additional, configurations, the user can manipulate the perspective of the virtual/augmented content as if the user was holding the three-dimensional measurement. In such configurations, movement of the user's hands can be tracked (e.g., via cameras, infrared, laser, or any other suitable mechanism for tracking hand movement/gestures) and the virtual/augmented content can be updated to reflect those movements.

In certain embodiments, an AR environment can be configured with a ground warning system to visually highlight one or more areas that are unacceptable to be shorted via a ground clip or wire; alternatively or in addition thereto, the system can visually highlight contacts that are acceptable to be grounded. This would provide visual guidance to advantageously allow a user to connect probe grounds to exact locations and eliminate any guesswork or user error.

FIG. 1 is a block diagram illustrating an example of an electronic test and measurement environment 100 having an augmented reality system incorporated therewith in accordance with certain implementations of the disclosed technology. In the example, the environment 100 includes a test and measurement device 108, such as an oscilloscope, that is coupled with a probe 106 configurable to interact with a device under test (DUT) 104. The DUT 104 may forward a waveform to the test and measurement device 108 via probe 106 for processing (e.g., digitizing, triggering, measuring, etc.) to produce waveform data from the waveform (e.g., a digital representation of the waveform, waveform measurements, etc.).

The waveform data may then be forwarded to a computing device 110 which can be configured to format the waveform data for presentation to a user via a display device 112 such as a head-mounted display, a tablet device, an image display screen, or a display of a mobile phone, for example. It will be appreciated that data can alternatively be presented, for example, via a tablet with a rear facing camera to capture images of the physical environment over which augmentation content can be overlaid. Any devices capable of presenting the virtual/augmented content described herein overlaid on a physical environment are contemplated as being within the scope of this disclosure. As such, any reference to a head-mounted display herein can equally refer to any other suitable display device. Also, in certain embodiments, the display device 112 is at least partially transparent.

In some instances, the test and measurement environment 100 can include one or more data store(s) 114. Data store(s) 114 can be separate from the other components depicted (e.g., on one or more servers or other computing devices), or could be included within one or more of the depicted components. In some instances, data store(s) 114 can provide information regarding DUT 104 (e.g., design schematics, probing points, reference waveforms, etc.), or any other applicable information, to computing device 110 for presentation to the user via head-mounted display 112. As such, the user may be able to view the augmentation content while viewing DUT 104 and/or waveform data associated with DUT 104.

While shown as multiple distinct components, it will be appreciated that any or all of the components of the test and measurement environment 100 can be integrated into fewer components (e.g., the computing device 110 and the head-mounted display device 112 could be combined into a single component), or could be expanded into more components. While a single DUT 104 and test and measurement device 108 are depicted as being single components, it will be appreciated that multiple DUTs and/or multiple test and measurement devices can be included within the test and measurement environment 100 without departing from the scope of this disclosure.

In certain embodiments, the head-mounted display device 112 can have one or more cameras 116 integrated therewith. These camera(s) 116 can capture images from the physical environment. The images of the physical environment can be processed (e.g., by the head-mounted display device 112 or the computing device 110) to enable identification of location indicia which can be utilized in identifying overlay locations for placement of the augmentation content within the physical field of view of the physical environment, for example. Cameras 116 can also include cameras integrated with probe 106 and/or DUT 104 which can be used as a source of augmentation content (e.g., augmentation image 220 of FIG. 2B).

As used herein, augmentation content can include anything that is outside of the physical field of view, but is processed to augment the physical field of view. Such augmentation content can include, for example, a video feed from a camera integrated with probe 106, schematics of a DUT, waveform data captured by probe 106, etc. Presenting this augmented content in an augmented reality (AR) environment can provide for certain advantages. For instance, waveform data, portrayed in an augmented reality (AR) environment can advantageously allow the user to inspect and interact with the content in three-dimensional form in front of them within a three-dimensional (3D) physical space. For example, the AR environment can be configured to allow the user to see the content in 3D form, rotate the content, walk around the content, zoom in and out of the content, and compress and expand the content. Controls coupled to the head-mounted display device 112 may also allow the user to interact with waveform data stored on the computing device 110 and/or oscilloscope 108 (and/or waveform data sampled in real time by the oscilloscope 108) to change the view of such waveform data.

In certain embodiments, the data store 114 can be configured to store augmentation settings for dynamically augmenting a physical testing environment. Such augmentation settings may include, but are not limited to, a location, position, orientation, or combination thereof, within the display device 112 for an augmentation image. The computing device 110 can create the augmentation image based on the augmentation settings and an input feed received from the physical testing environment, e.g., by the probe 106 or the camera 116. The computing device 110 can then output the augmented image to be overlaid on the physical testing environment to augment the user's view of the physical testing environment, e.g., by causing the display device 112 to visually present the augmented image overlaid on the physical testing environment to the user. It will be appreciated that, where the display is at least partially translucent, the augmented image can be displayed to align with aspects of the physical testing environment that are viewable through the translucent display to cause the overlay of the augmentation image on the physical environment. In such instances, images of the physical testing environment can be captured and utilized to determine aspects of the physical environment for placement of augmented content within the augmented image.

In general, an AR approach makes content virtually tangible and, as such, opens up new modes of exploration that were not previously available on conventional fixed displays. For example, an AR approach can allow viewing by multiple users within a shared, real-world, physical space by employing multiple head-mounted displays coupled to one or more computing devices via a network (e.g., wired, wireless, or any combination thereof).

The waveform data generated by the oscilloscope 108 and/or other test and measurement devices can serve as the augmented content in an AR environment. For example, the controls may allow the user to virtually place a virtual representation of the waveform on a circuit board or on the DUT 104 at the physical location where the corresponding signal physically resides. The virtual representation of the waveform may be virtually placed on the user's desk for further analysis, on a conference table for multiple users to observe simultaneously, etc.

By displaying static waveform data and/or streaming dynamic/live waveform data using an AR approach, a user can utilize the head-mounted display device 112 to view the waveform in true 3D, as though the waveform data were a solid physical object within the physical environment surrounding the user. This represents an unprecedented level of freedom in the exploration of waveform data, thereby allowing a user or multiple users to simultaneously view a virtual waveform in physical space from multiple viewpoints, such as from underneath, behind, on top of, and/or from within the waveform. This may allow a user to debug and/or qualify a complex device or circuit, for example. This may also allow a user to look directly at a probed physical area and view the virtual waveform floating above a probe that is capturing the waveform.

Figure 2A:
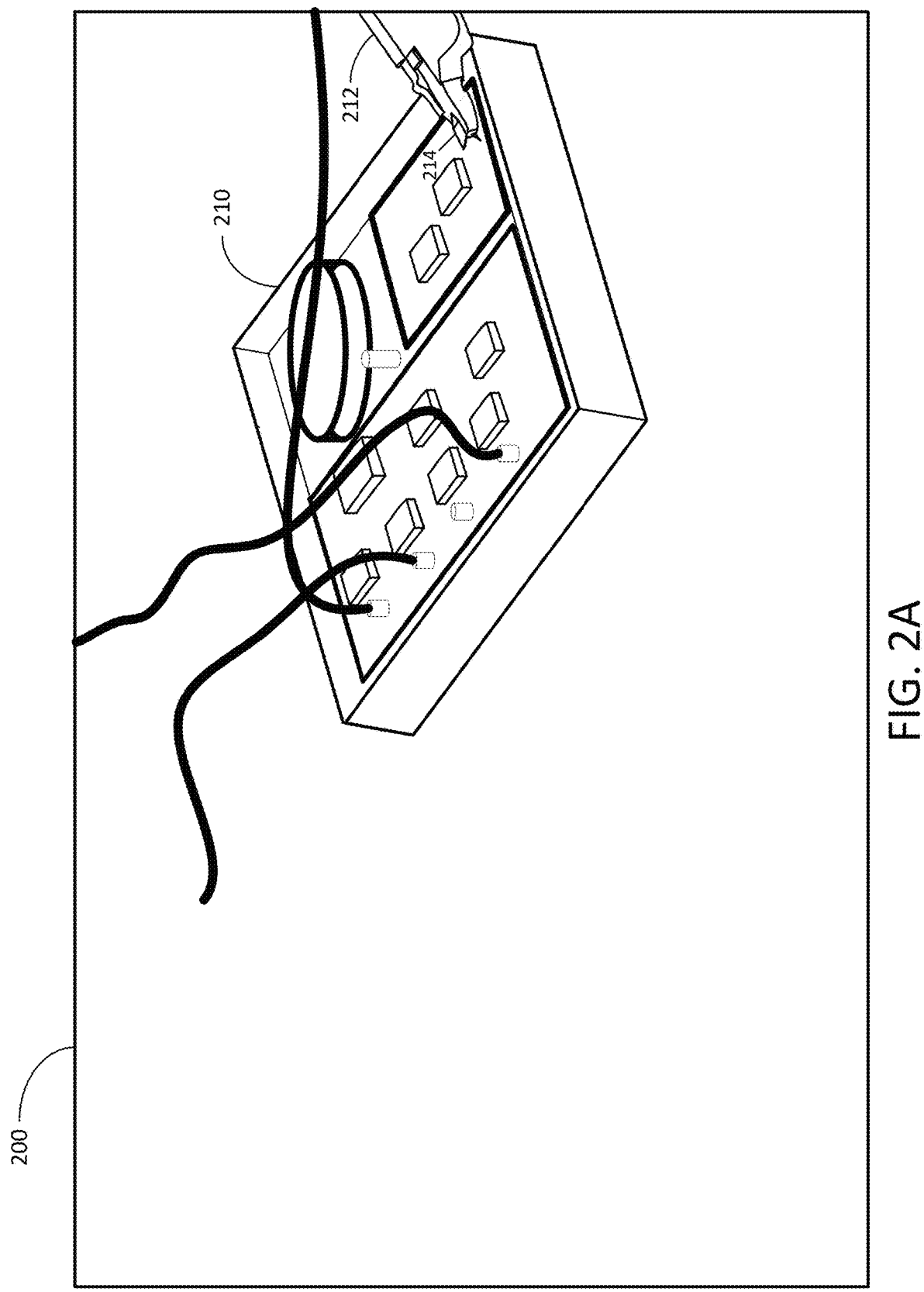
FIG. 2A illustrates a first example of a physical field of view of a physical testing environment in accordance with certain implementations of the disclosed technology.

FIG. 2A illustrates a first example of a physical field of view of a physical testing environment 200 in accordance with certain implementations of the disclosed technology. In the example, a DUT 210 is visible within the physical testing environment 200. A camera 214 may be integrated with a probe/probe tip 212 and images or video from this camera can be streamed into an AR environment to enable the user to effectively have a heads-up-display (HUD) with a magnified view of the probed area, while still viewing the DUT 210, probe location, and/or test and measurement device. This can enable the user to more precisely place the probe tip at a desired probe point, which can result in a better electrical connection between the probe tip and the probe point.

Figure 2B:
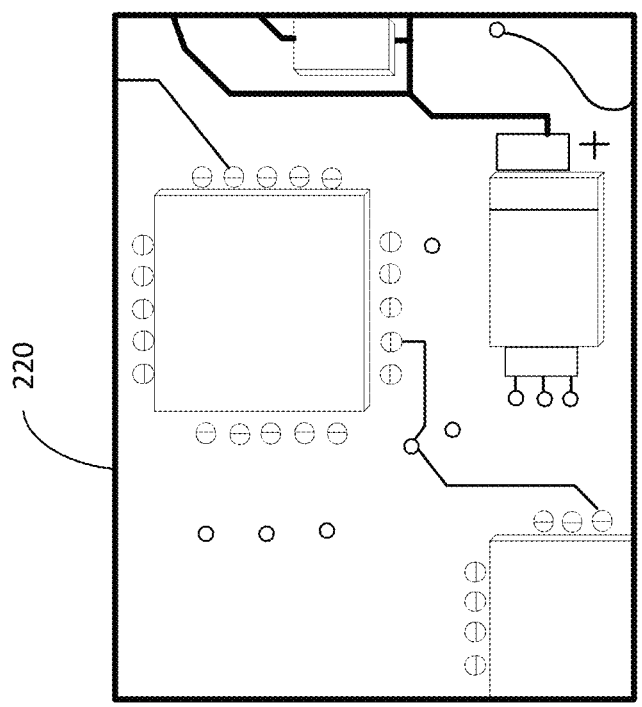
FIG. 2B illustrates a first example of an augmentation image in accordance with certain implementations of the disclosed technology.

FIG. 2B illustrates a first example of an augmentation image 220 in accordance with certain implementations of the disclosed technology. In the example, the augmentation image 220 is a magnified view of the probe area, e.g., where the user is presently positioning the probe on the DUT 210. In certain embodiments, the augmentation image may include a generated waveform related to the DUT 210 in the physical testing environment 200.

Figure 2C:
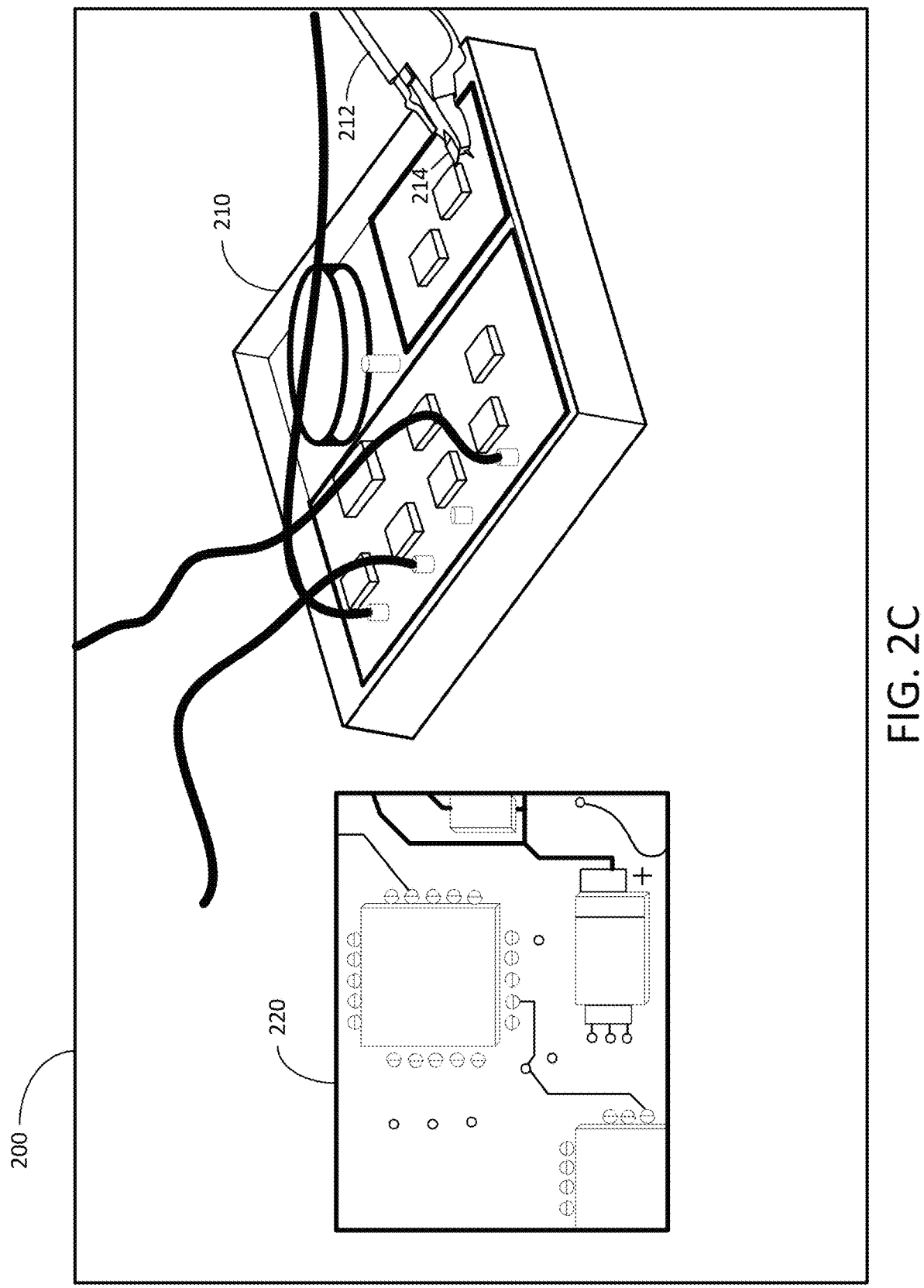
FIG. 2C illustrates a first example of an augmented field of view in accordance with certain implementations of the disclosed technology.

FIG. 2C illustrates a first example of an augmented field of view 200 in accordance with certain implementations of the disclosed technology. In the example, the user is able to use a display device, such as a head-mounted display device, to concurrently view the physical testing environment, including the DUT 210, probe 212, and the augmentation image 220, e.g., the magnified view of the probe or probing area of the DUT 210. Augmentation settings may be used by the user to select and/or change the location, position, orientation, etc. of the augmentation image.

Figure 2D:
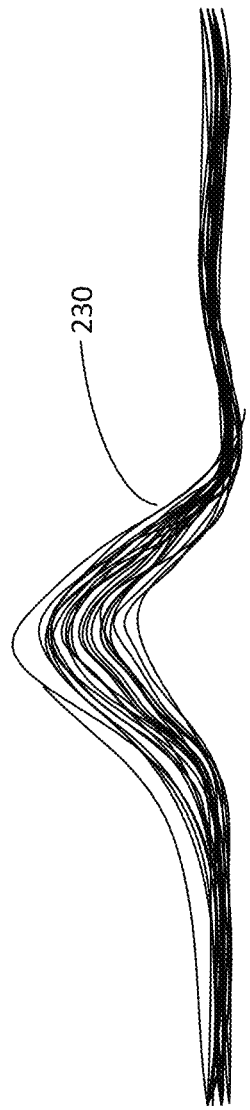
FIG. 2D illustrates a second example of an augmentation image in accordance with certain implementations of the disclosed technology.

FIG. 2D illustrates a second example of an augmentation image 230 in accordance with certain implementations of the disclosed technology. In the example, the augmentation image 230 is a waveform associated with the probe 212 or probing location on the DUT 210.

Figure 2E:
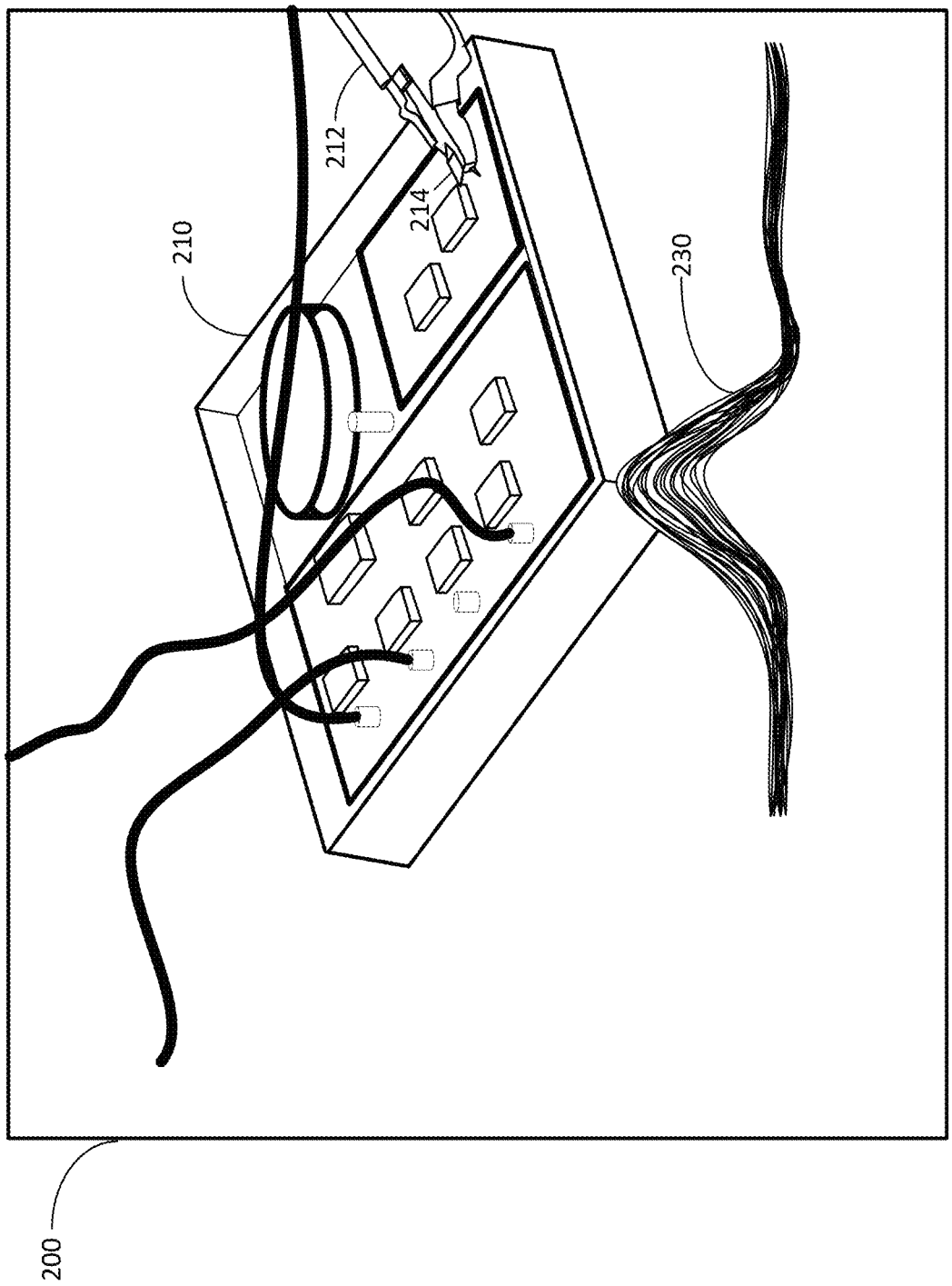
FIG. 2E illustrates a second example of an augmented field of view in accordance with certain implementations of the disclosed technology.

FIG. 2E illustrates a second example of an augmented field of view 200 in accordance with certain implementations of the disclosed technology. In the example, the user is able to use the display device to concurrently view the physical testing environment, including the DUT 210, and the augmentation image 230, e.g., the waveform associated with the probe and/or probing area of the DUT 210. Augmentation settings may be used by the user to select and/or change the location, position, orientation, etc. of the waveform.

Figure 2F:
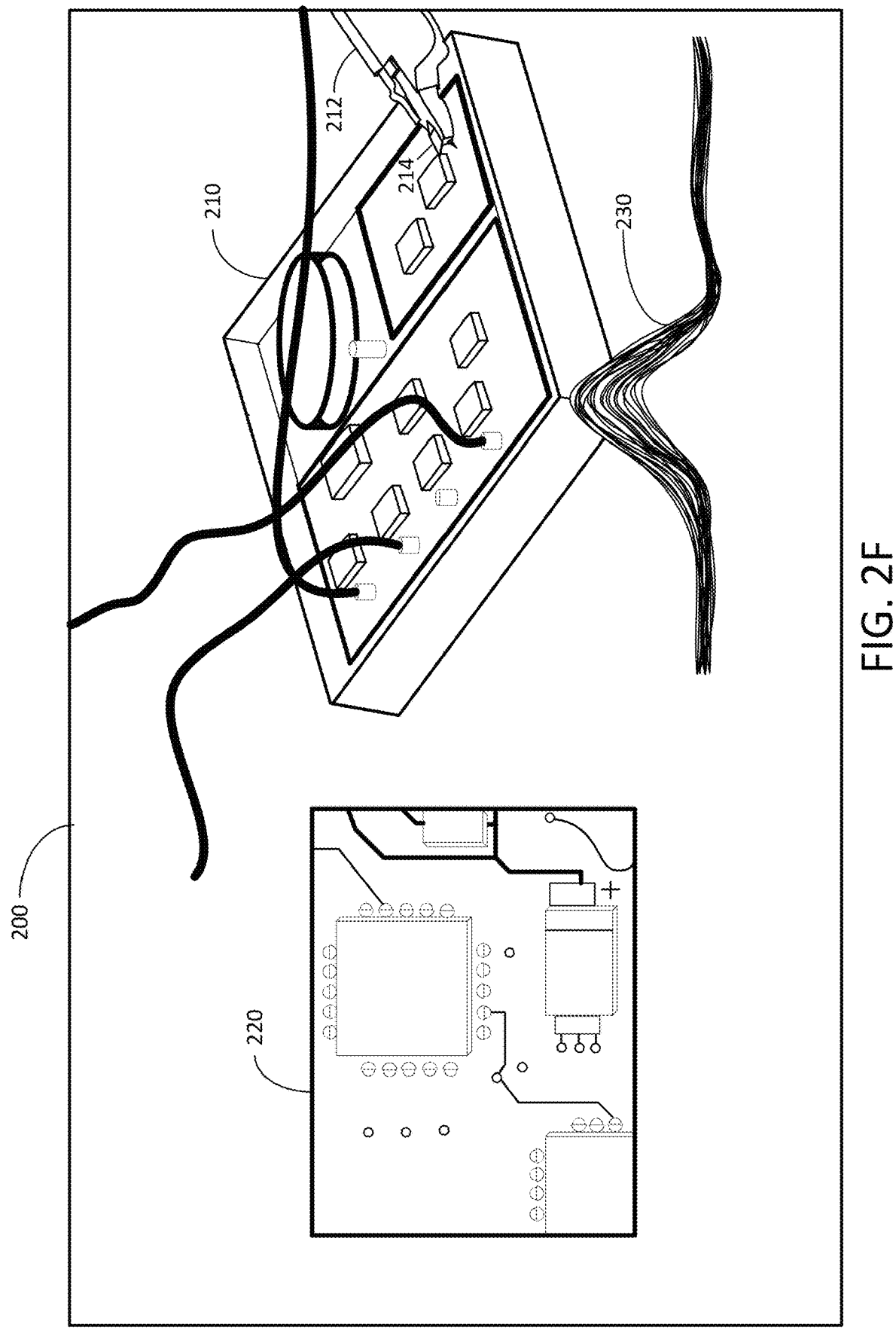
FIG. 2F illustrates a third example of an augmented field of view in accordance with certain implementations of the disclosed technology.

FIG. 2F illustrates a third example of an augmented field of view 200 in accordance with certain implementations of the disclosed technology. In the example, the magnified view of a probe area 220 and the waveform 230 are both overlaid on the physical environment including the DUT 210 in a single immersive view. Such an immersive view can advantageously allow the user to increase both focus and efficiency. This implementation also carries the advantage that a benchtop microscope (which is becoming increasingly necessary when working with microelectronics) may no longer be necessary, which can save cost and also result in process improvement, both of which offer benefits that can be passed directly to the customer.

In certain embodiments, the system may be configured to selectively guide a user to probe specific points on a DUT. This can be especially beneficial for complex circuit boards and can boost productivity and reduce errors in testing, while also enabling repeatability of tests. In such embodiments, a virtual overlay can be generated from, for example, user input (such as CAD files and test point selection data) and can enable virtual guidance to be overlaid on a physical DUT to allow the user to probe exact locations and eliminate guesswork or user error in locating the exact test point for a particular test. The user can upload the proper data files in software, and then select a single test point, or be guided through a sequence of test points, by the visual indication of a virtually-overlaid colored dot or symbol as discussed with reference to the examples below.

In some instances, engineers or technicians might want to document their work. When their work takes place in an AR environment, as configured herein, they can see the progress and the results correlated with the physical environment surrounding them, but now they may desire a way to document these visuals so the results can be shared with others or saved for future reference.

In such instances, the AR environment described herein can be configured to perform a virtual AR screen dump utility, or AR screen recording, which can record a replication of whatever the user is seeing within the AR environment (both virtual and physical) at a point in time or for a period of time. In embodiments utilizing a transparent display, a capture of the physical environment can be included with the virtual content placed accordingly to enable the AR environment to be correctly captured within the documentation.

Figure 3A:
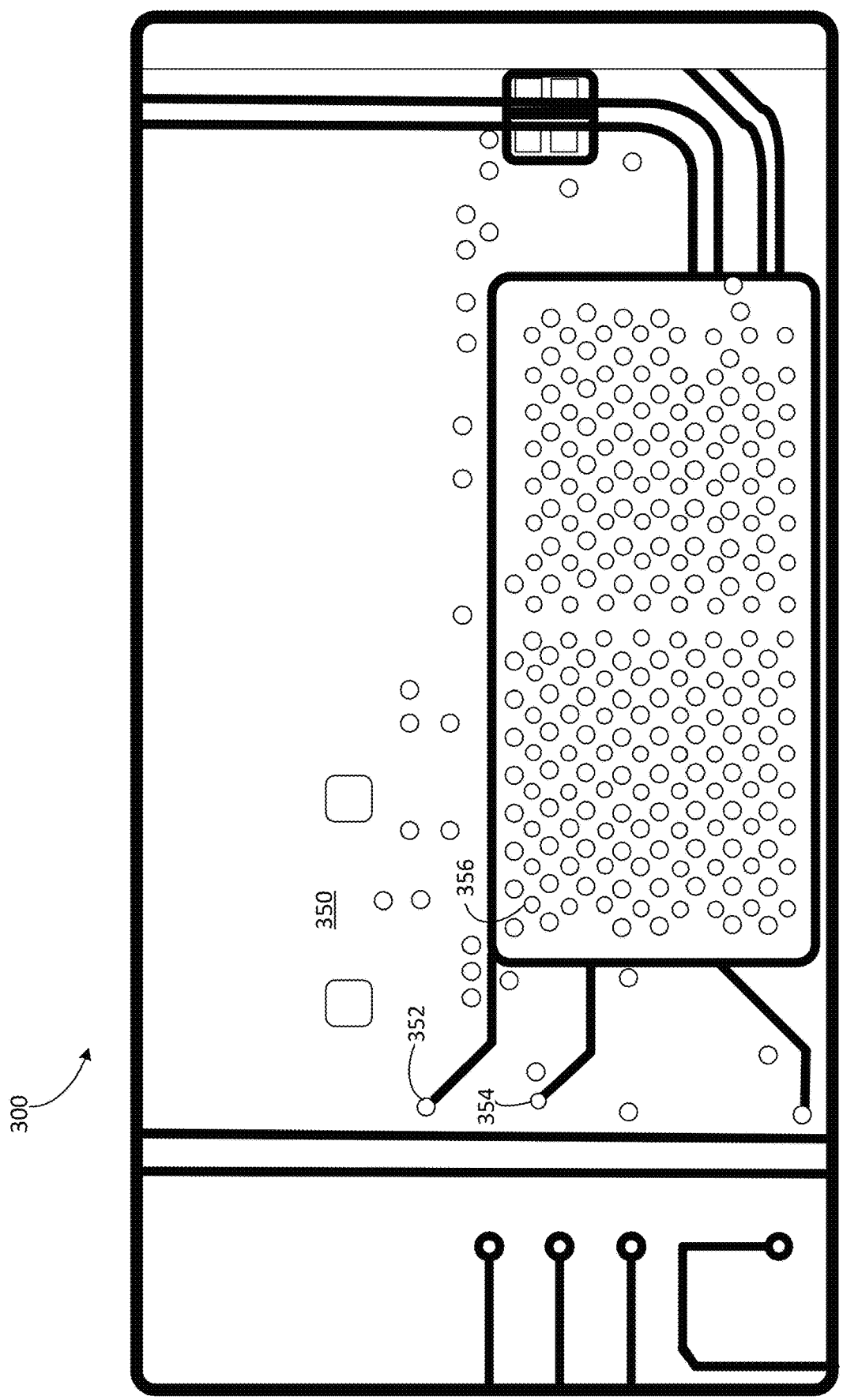
FIG. 3A illustrates a second example of a physical field of view of a physical testing environment in accordance with certain implementations of the disclosed technology.

FIG. 3A illustrates a second example of a physical field of view of a physical testing environment 300 in accordance with certain implementations of the disclosed technology. In the example, a DUT 350 is visible within the physical testing environment 300. The DUT 350 has various potential probing points and connections therebetween including 352, 354, and 356, for example.

Figure 3B:
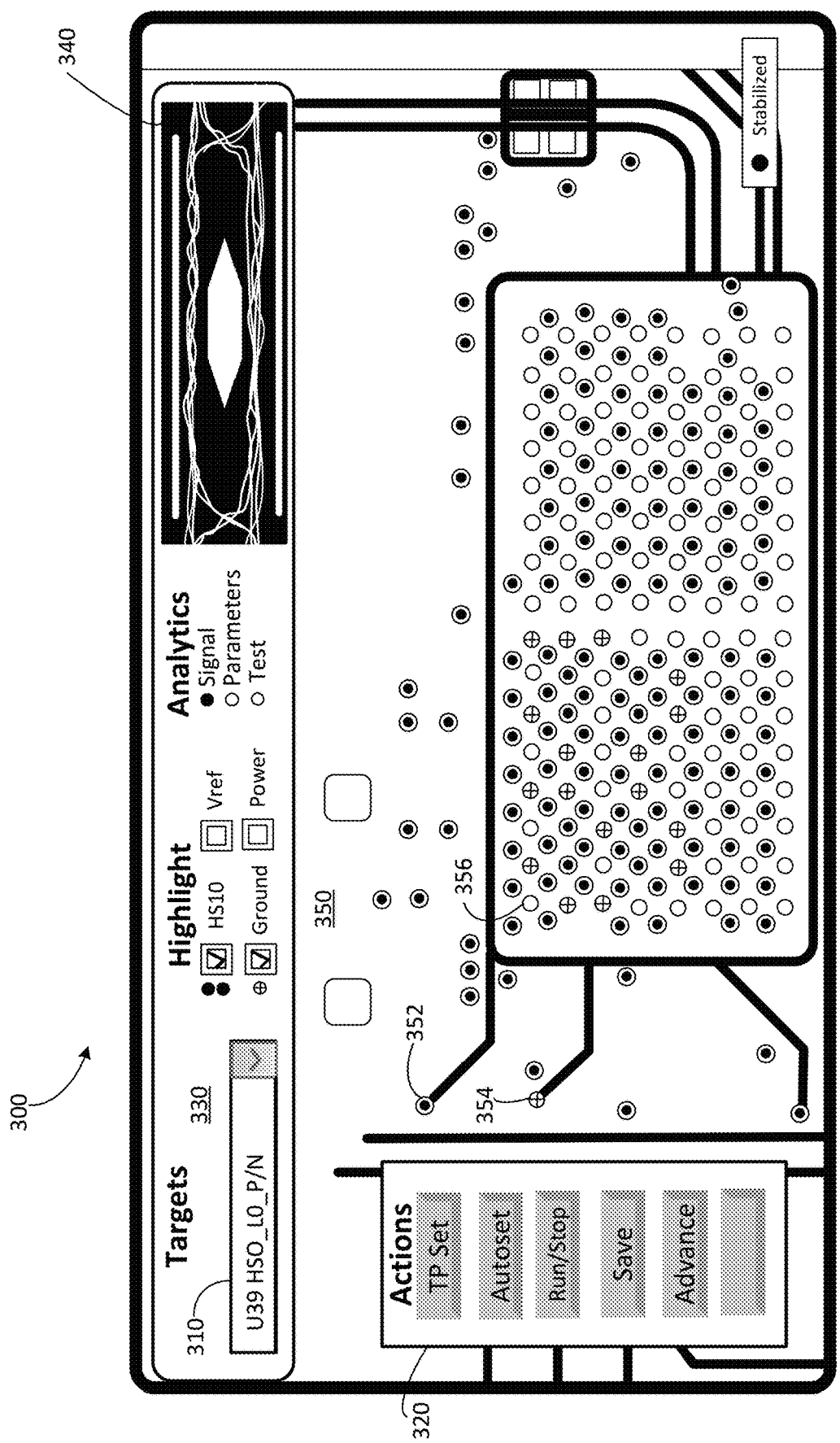
FIG. 3B illustrates a first example of an augmented field of view in accordance with certain implementations of the disclosed technology.

FIG. 3B illustrates a first example of an augmented field of view 300 in accordance with certain implementations of the disclosed technology. Here, the augmentation image comprises a virtual user interface having multiple portions such as a first information portion 330 and a second information portion 320 such as a virtual control panel having multiple virtual controls. The first information portion 330 includes a selection component 310 that may provide an indication of an area to be tested or an area to be avoided. The first information portion 330 may also include a waveform portion 340 configured to display a waveform associated with an area being test, for example. The second information portion 320 may include a number of actions that the user may select.

In this example, the virtual overlay also includes probe points on the physical environment, e.g., to help prevent a user from incorrectly grounding the test and measurement system. In the example, "+" dots indicate ground contacts that are acceptable for use by a probe grounding clip or wire. In the example, the virtual overlay also includes dots to indicate points that are active and/or suitable for testing. It will be appreciated that other symbols, icons, colors, etc. may be used to indicate such contact points.

Such a ground warning system can be implemented by storing the location (e.g., coordinate location), physical indicia, or other suitable location information for contacts located on the DUT 350. This location information could then be correlated with an indicator of whether the location is an acceptable ground. Based on the location information and the correlation, the overlay image 300 may be generated and overlaid onto the DUT to enable the operator to readily identify those locations that are acceptable and/or unacceptable for the ground connection. Such an image, or the overlaid location thereof, can be updated in real time to maintain the indicators in the proper location, even as the user moves within the physical environment relative to the DUT 350, for example.

Figure 3C:
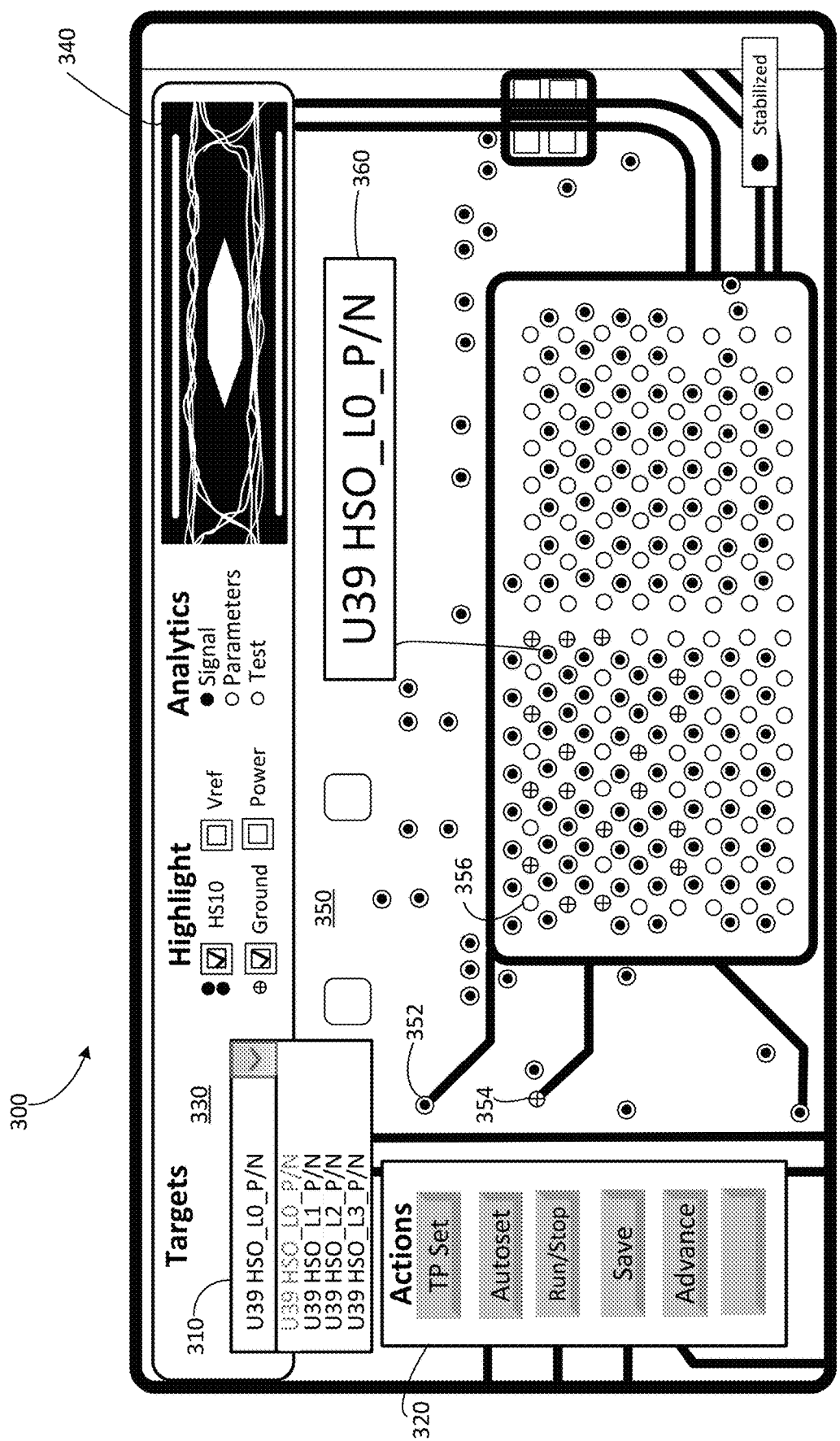
FIG. 3C illustrates a second example of an augmented field of view in accordance with certain implementations of the disclosed technology.

FIG. 3C illustrates a second example of an augmented field of view 300 in accordance with certain implementations of the disclosed technology. In the example, the user interacts with the selection component 310 to select a particular probe point. A virtual label 360 provides a visual indication of the physical location of the probe point on the DUT 350, e.g., to allow the user to easily locate the probe point and establish a connection with it by way of a probe tip. The waveform portion 340 may visually present a waveform corresponding to the probe point once the user has established the connection therewith.

Figure 3D:
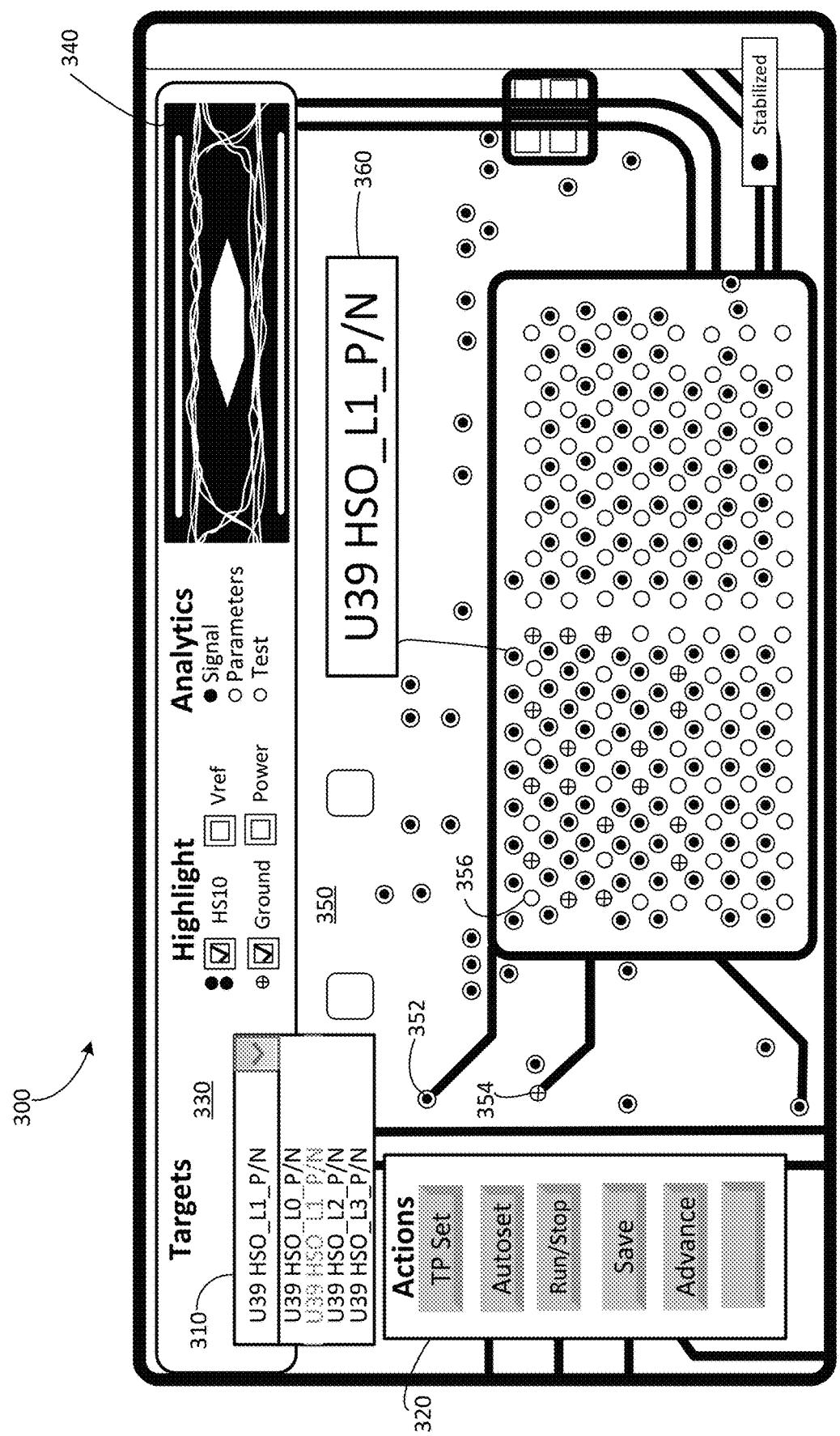
FIG. 3D illustrates a third example of an augmented field of view in accordance with certain implementations of the disclosed technology.

FIG. 3D illustrates a third example of an augmented field of view 300 in accordance with certain implementations of the disclosed technology. In the example, the user interacts with the selection component 310 to select another probe point. The virtual label 360 again provides a visual indication of the physical location of the probe point on the DUT 350, e.g., to allow the user to easily locate the probe point and establish a connection with it by way of a probe tip. The waveform portion 340 may dynamically change/update to visually present a waveform corresponding to the newly-selected probe point once the user has established the connection therewith.

Figure 3E:
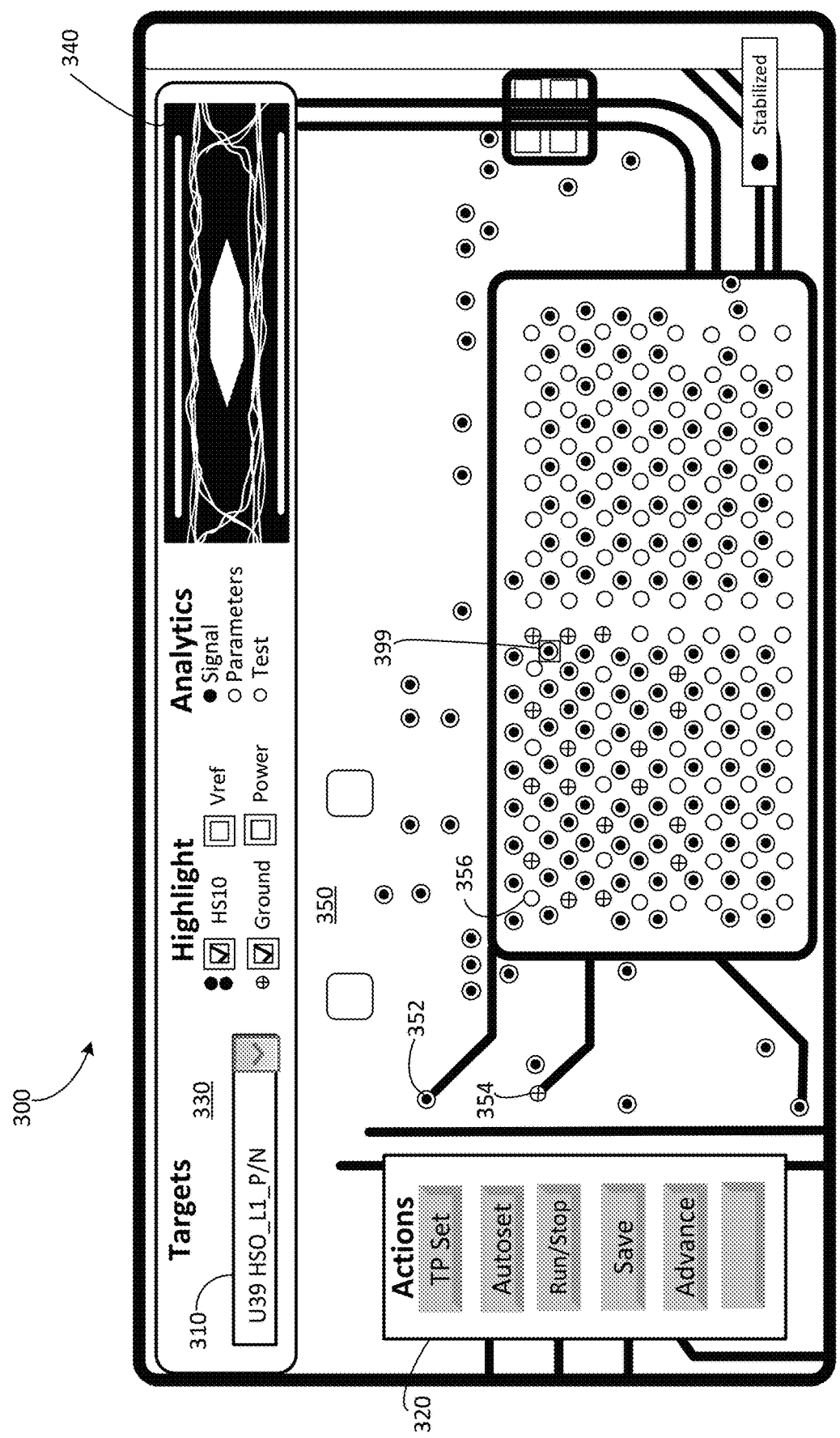
FIG. 3E illustrates a fourth example of an augmented field of view in accordance with certain implementations of the disclosed technology.

Certain embodiments may include the placement of a virtual marker within the augmentation image responsive to the user causing a measurement probe to make physical contact with a certain portion within the physical testing environment. FIG. 3E illustrates a fourth example of an augmented field of view 300 in accordance with certain implementations of the disclosed technology. In the example, a virtual marker includes a box 399 that is positioned around a probe point at which a connection, e.g., with a probe, is maintained. That is, the virtual marker corresponds to the identified location of the certain portion. This may advantageously allow the user to readily visually confirm that the probe stays connected to the particular point on the DUT 350 while the user performs one or more other activities that may be in a separate physical location from the physical testing environment.

Figure 4:
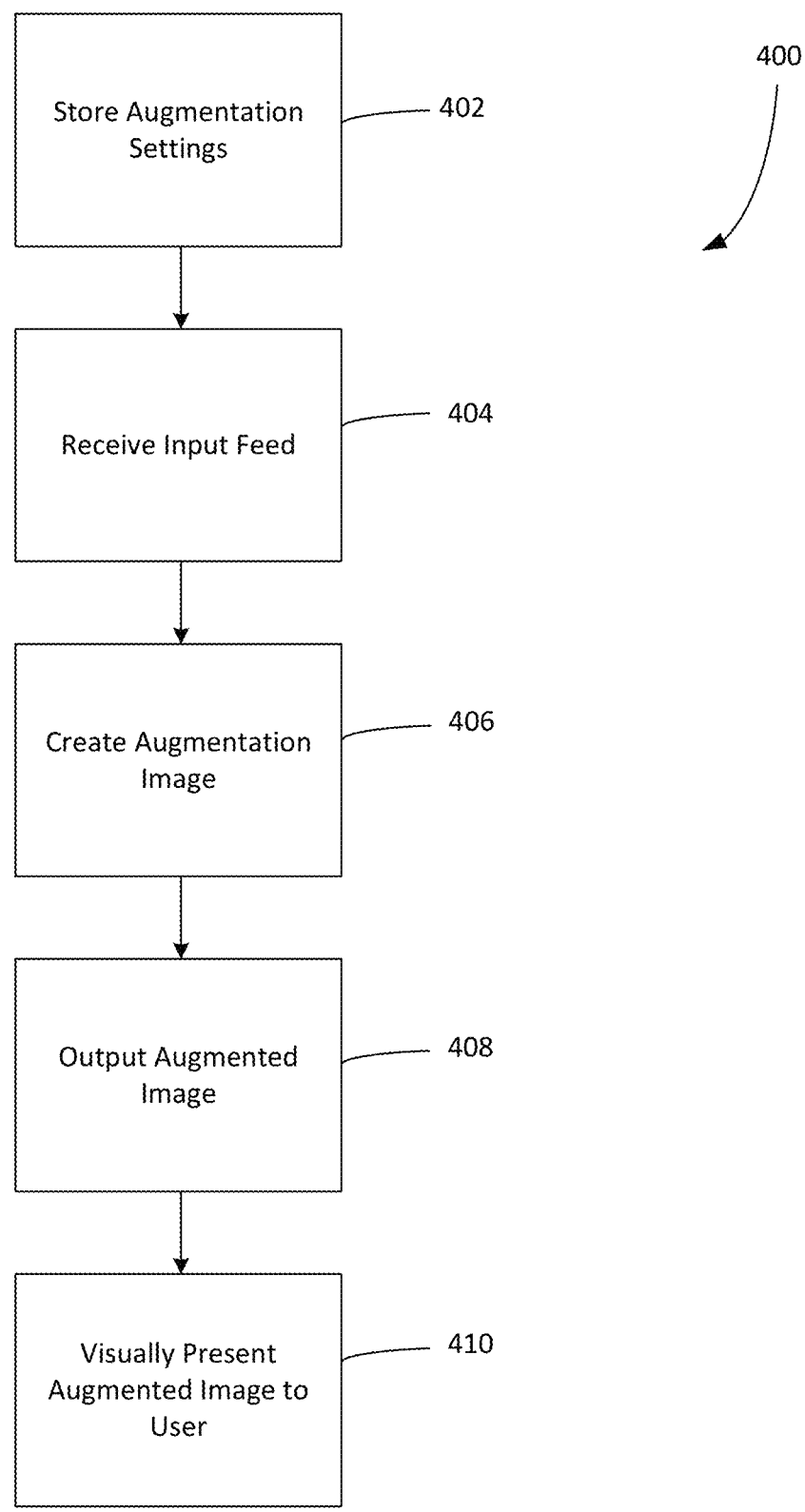
FIG. 4 is a flow diagram illustrating an example of a processor-controlled method for an electronic test measurement system in accordance with certain implementations of the disclosed technology.

FIG. 4 is a flow diagram illustrating an example of a processor-controlled method 400 for an electronic test measurement system, such as the electronic test measurement system illustrated by FIG. 1, in accordance with certain implementations of the disclosed technology.

At 402, augmentation settings are stored, e.g., by one or more data stores. The augmentation settings may be used by the system for dynamically augmenting a physical testing environment. The augmentation settings may indicate a position, location, orientation, or combination thereof of augmentation content to be visually presented to a user, e.g., by a display device. In certain embodiments, the augmentation settings may be configurable to allow the user to select a locational position for the augmented image within the display device. Any or all of these augmentation settings may be edited by the user, in some cases dynamically.

At 404, an input feed from a physical testing environment is received, e.g., by a computing device. The input feed may include a data feed captured by a probe, a video feed captured by a camera attached to the probe, or a representation (e.g., a stored representation) of the physical environment, for example. In certain embodiments, the camera may be integrated into the display device.

At 406, an augmentation image is created, e.g., by the computing device. The augmentation image may include a virtual overlay of virtual or augmentation content on the physical environment to augment the user's view of the physical testing environment. The augmentation image may be created based on either or both of the augmentation settings and the input feed.

At 408, the augmentation image that was created at 406 is outputted, e.g., by the computing device. The computing device may output the augmentation image to any of a number of suitable display devices, for example. Alternatively or in addition thereto, the computing device may output the augmentation image to one or more storage devices, e.g., for later use by the user or other user(s).

At 410, the augmented image is visually presented to a user, e.g., by a display device such as a head-mounted display, a tablet device, an image display screen, or a display of a mobile phone. The display device may be at least partially transparent. In certain implementations, the augmented image may be visually presented to multiple users, e.g., by way of multiple display devices. For example, a first user may interact with a head-mounted display device while a second user may watch the first user's interactions by way of a traditional desktop computer or tablet device.

Certain implementations may include a measurement probe controllable by a user to interact with the physical testing environment, wherein the camera is coupled to the measurement probe. In such embodiments, the computing device may provide instructions to a user and further make changes to the instructions responsive to input received from the user by way of the measurement probe.

Certain embodiments may include using the system or techniques described herein with a time domain reflectometer (TDR). For example, the system may enable the user to use a display device to visualize a TDR trace on a circuit board along with an augmentation image that includes a calculated impedance or any other suitable measurement associated with the TDR trace.

Figure 5:
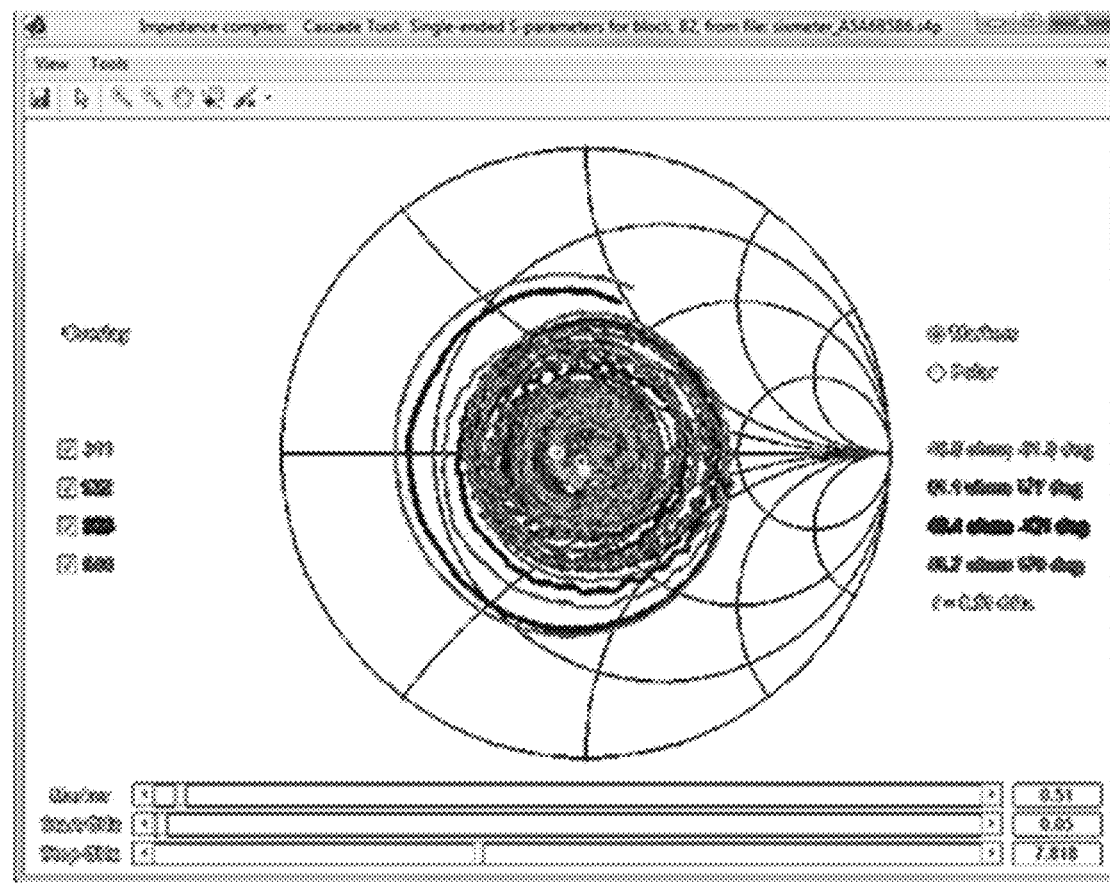
FIG. 5 illustrates an example of a Smith Chart diagram in accordance with various embodiments of the present disclosure.
Figure 6:
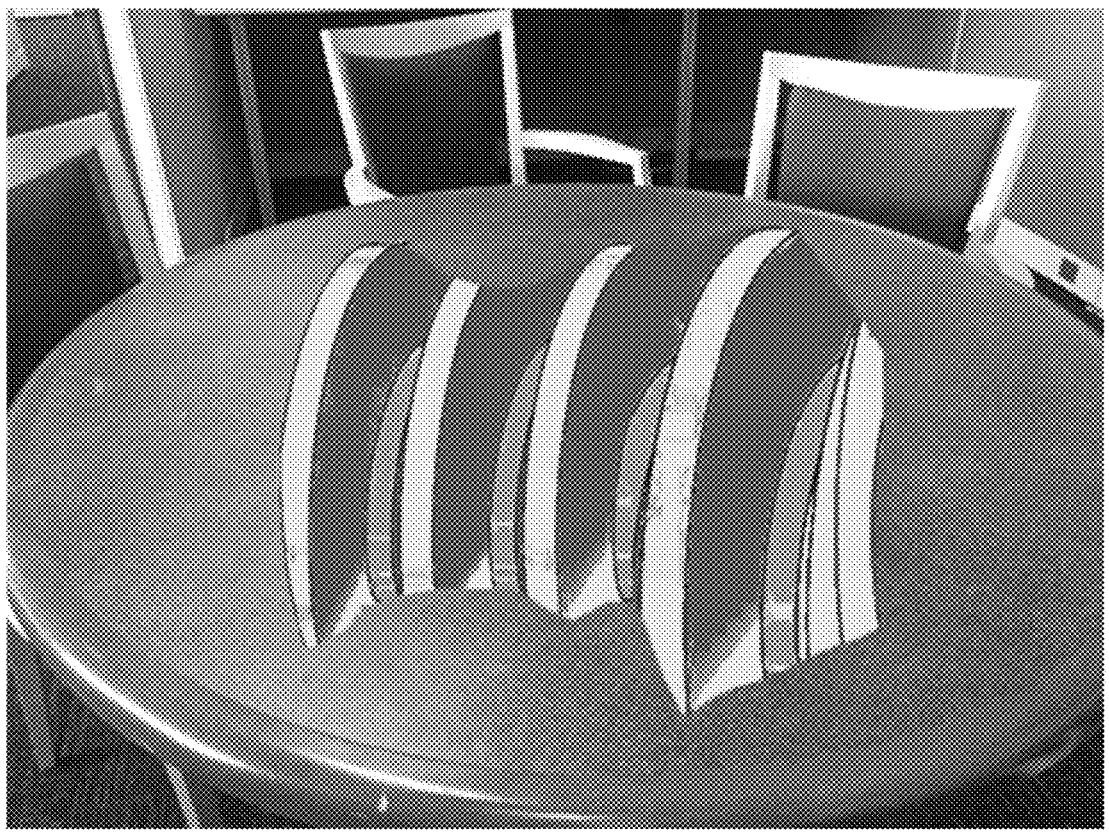
FIG. 6 illustrates example data from the Smith Chart diagram illustrated by FIG. 5 in accordance with various embodiments of the present disclosure.

With regard to FIGS. 5 and 6, Smith Charts are a common way of displaying impedance versus frequency for RF measurement and analysis (see FIG. 5). Typical usage includes taking impedance measurements in the complex plane for a given DUT. Without changing any test parameters, subsequent measurement results show the same Smith Chart impedance trace for each frequency sweep analysis. However, a common test parameter adjustment is the RF power level, which changes DUT impedance and the resulting Smith Chart plot. Typically, RF engineers analyze this data as a set of individual data sets, one set for each step in the DUT's power level corresponding to the impedance versus frequency analysis.

However, if these same Smith chart measurements were stacked together (e.g., by a test and measurement device) into the z-axis, a 3D representation can be generated that can be viewed/manipulated in an AR environment, such as that illustrated by FIG. 1. This provides RF engineers the first visual tool of its kind to assist in visualizing how impedance versus frequency is changing with power level. The 3D representation could then be rotated, pan/zoomed, separated (e.g., by expanding one or more axis) and explored in 3D space with RF markers. As a simple example, if the resulting 3D representation were rotated 90-degrees on its axis, a curve between the datasets would be readily recognized and could expedite the power tuning analysis (see FIG. 6). Furthermore, phenomena observable in 3D-space as a relationship between data sets could be more easily recognized and subsequently explored—an otherwise difficult task if the user is restricted merely to analysis of individual datasets.

Modern oscilloscopes limit users to viewing their data on a fixed two-dimensional (2D) screen. Typically, this also limits the presented data to 2D form—that is, no readily accessible three-dimensional (3D) viewing option exists. For example, histograms attempt to convey a sort of "third dimension" in terms of Waveform Data (e.g. Number of Hits, or a stacking up of data points within a given Histogram "bin"), but are a limited by the fixed 2D screen. Existing MATLAB-based solutions offering a MATLAB-generated 3D representation of Waveform Data are similarly limited to the fixed 2D displays. An Augmented Reality (AR) approach opens the door to unique and novel 3D display and interaction of content in a real-world setting.

Figure 7:
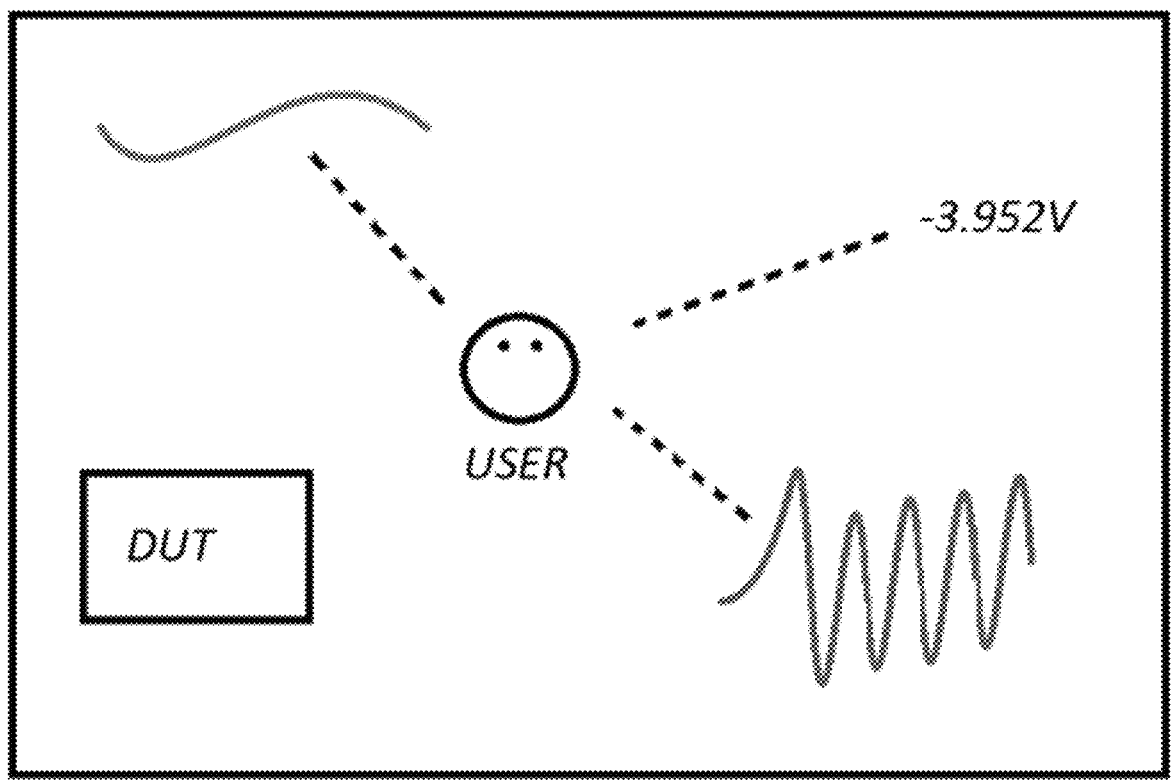
FIG. 7 illustrates an example of an Augmented Reality (AR) environment in accordance with various embodiments of the present disclosure.

An AR environment can be configured to enable a user to fill a physical location with virtual content. This expands the display technology from a fixed 2D display on the instrument and creates a highly customizable AR virtual environment (see FIG. 7). This allows the user to maximize physical oscilloscope screen space, or that of another test and measurement device, by moving multiple Waveforms or GUIs (graphical user interface) out of the physical screen and onto a desk or into the air surrounding the user, instrument, DUT, etc.

With AR, all the traditional limits of fixed 2D displays are removed, such as fixed size and fixed location, as well as limited size since the virtual environment is not necessarily limited by physical space. In other words, the room or space around the user now becomes the display for instrument output, whether that is waveforms or measurement data. AR can be viewed via modern display technologies, whether that is a mobile device (such as phone or tablet), a computer monitor, a projector, or through head-mounted displays (such as the Oculus Rift, HTC Vive, Microsoft Hololens, etc.).

Figure 8:
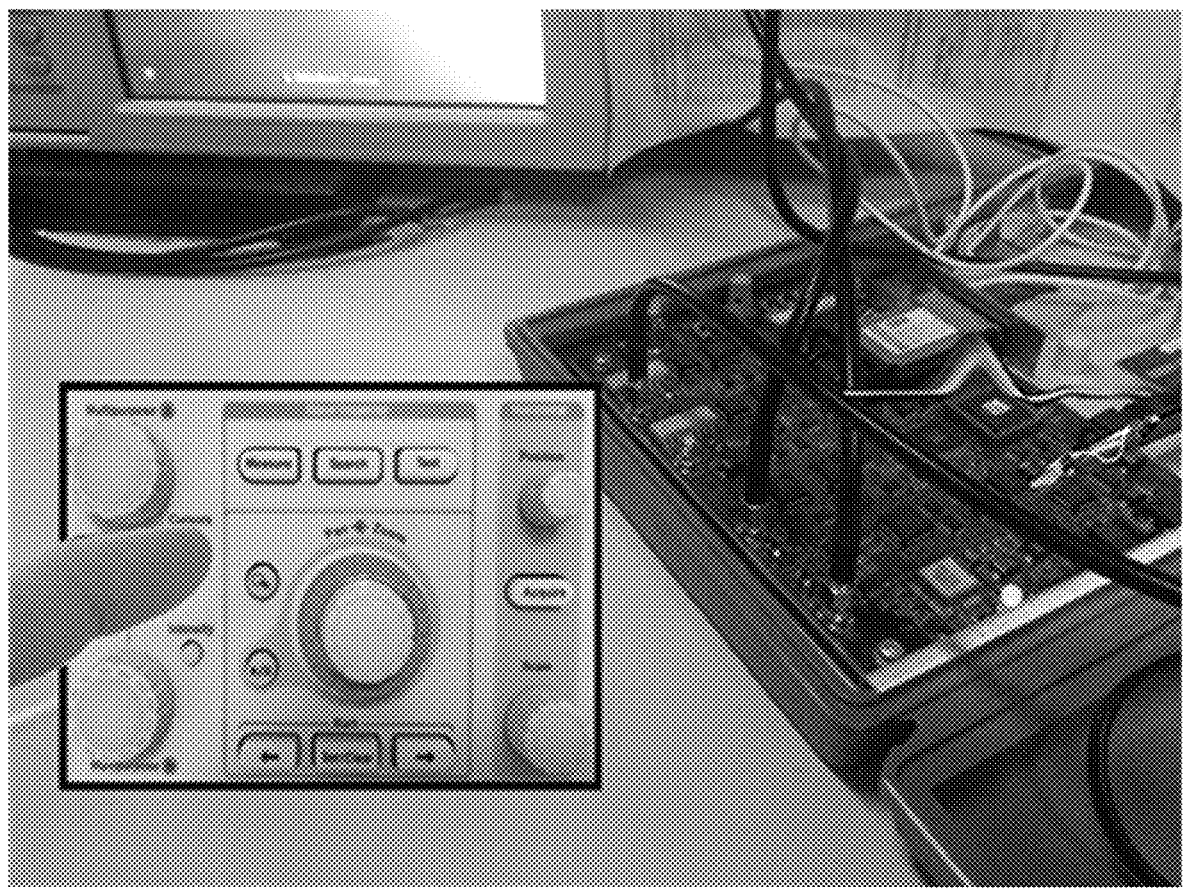
FIG. 8 illustrates an example of virtual controls of an oscilloscope front panel and a representation of a waveform both overlaid on a physical environment including a DUT, in accordance with various embodiments of the present disclosure.

In certain embodiments, the AR environment may also be configured to virtualize the controls of an instrument into a virtual representation. FIG. 8 depicts a heads-up-display in AR of a scope front panel, or a subset thereof, or the controls for a solutions application (e.g. 80SJNB) such that the user can continue to view the DUT while also controlling settings of the test and measurement instrument. This can include tracking (e.g. camera, Infrared, Laser, Eye tracking, etc.) of the user's motions to be able to select their input on the front panel displayed in AR, or to move to another area of the control panel where the virtual control panel is truncated due to any display area limitations. As with any overlay, this virtual front panel could be opaque or transparent to varying degrees. This feature opens the door to increased productivity and for enhanced remote scope control, whether from desk-to-lab or office-to-field. In such a configuration, the test and measurement device being controlled by the changes of settings to the virtualized controls can be configured to receive signals from the AR environment indicating changes made to the virtualized controls to enable the test and measurement device to effectuate such changes.

Figure 9:
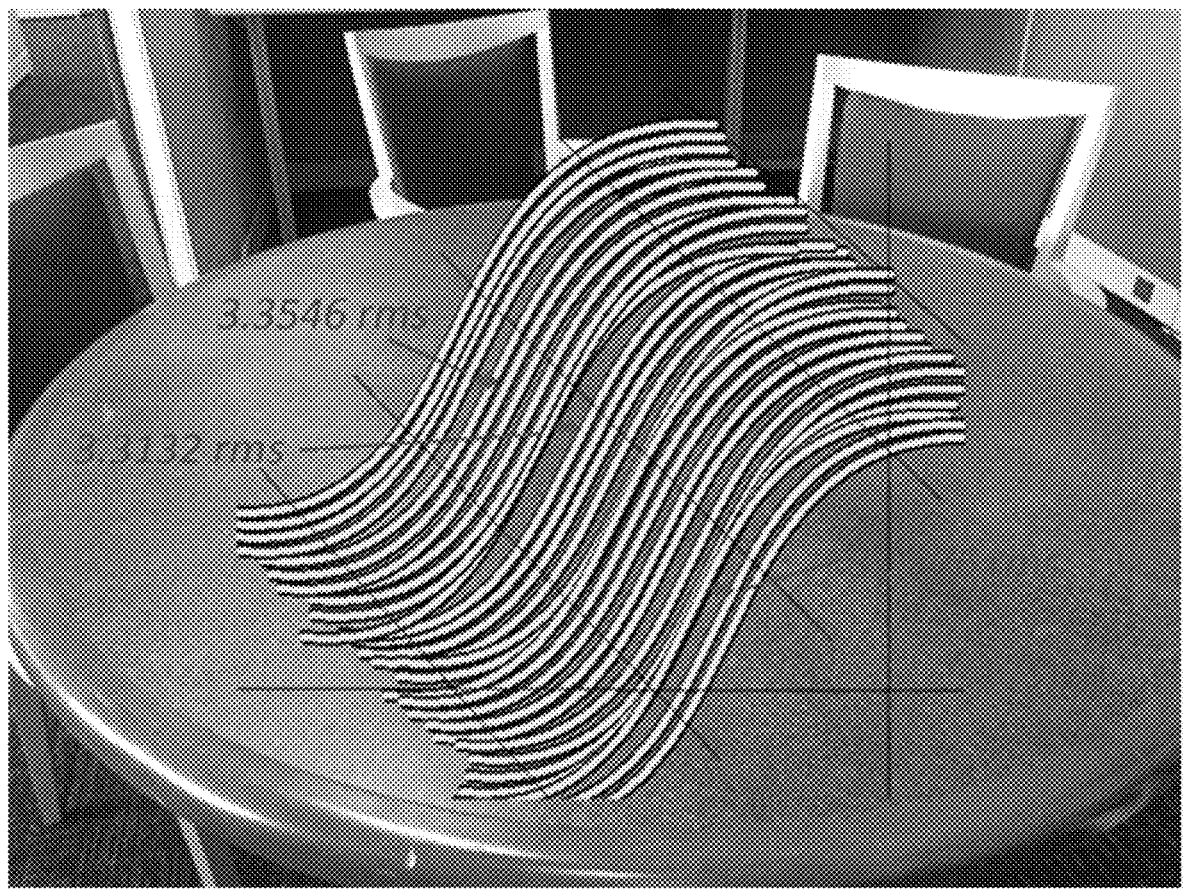
FIG. 9 illustrates an example of a waveform representation with visual cues overlaid on a physical environment to enable users to more easily accomplish complex measurements, in accordance with various embodiments of the present disclosure.

In some instances, 3D plots are generated and other complex operations are performed by a user for input in order to obtain an intended measurement. In many of these instances, it is an operation which visually requires 3D input even though customers are currently limited to 2D input, which can complicate things. In terms of complexity, consider Visual Trigger on oscilloscopes available from Tektronix®. Visual Trigger enables users an option to efficiently create a trigger based on visual elements (e.g., a specific point within a waveform) of a waveform designated by a user. Rather than sinking time into complex trigger settings and other considerations to achieve the desired result, the user can just point to a displayed element from which the complex trigger settings can be derived. In an AR environment, which is already better suited for the display of 3D results. An AR Visual Measurement setup feature could expedite complex measurement setups (e.g., utilizing those points identified within FIG. 9). Furthermore, Visual Trigger could also be extended into the realm of 3D in such an AR environment.

Figure 10:
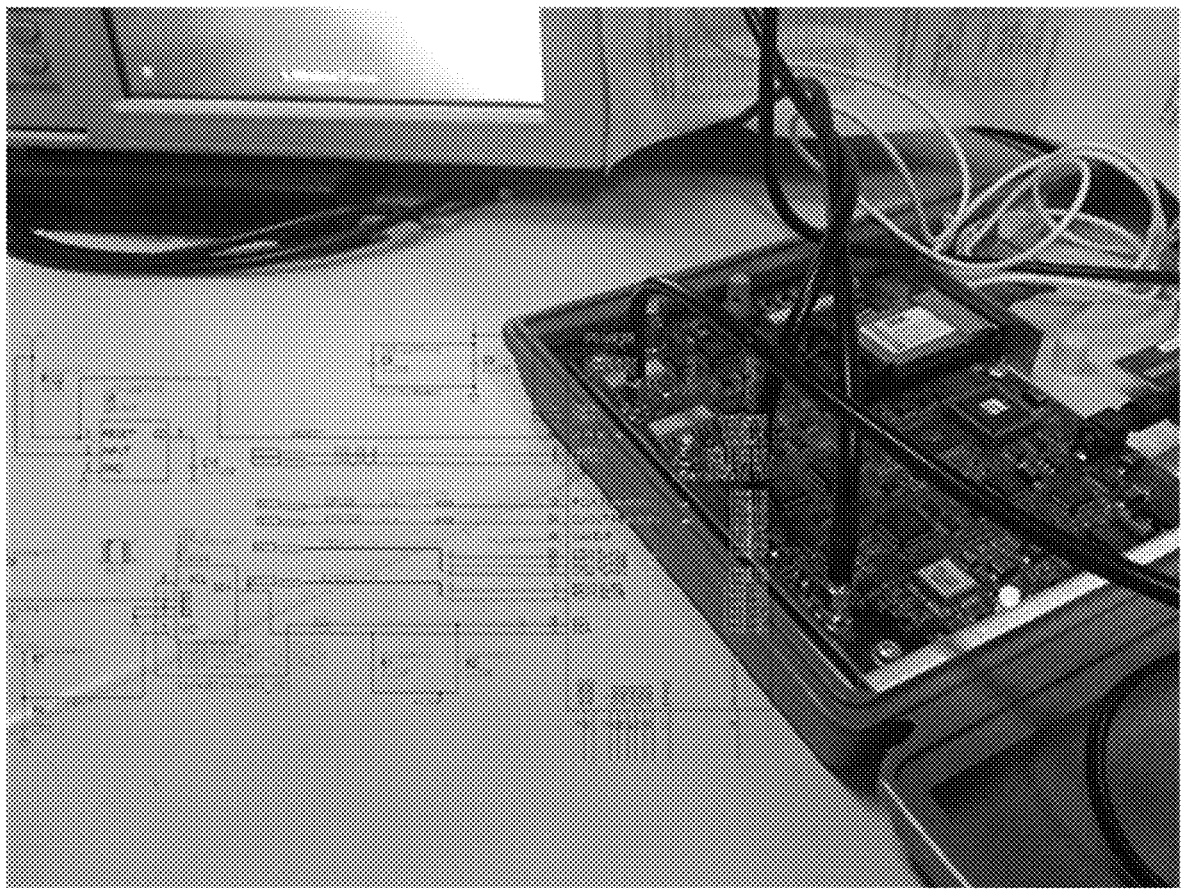
FIG. 10 illustrates a first example of design documents overlaid next to an associated DUT, to enable a user to reference CAD designs while simultaneously viewing the physical DUT, in accordance with various embodiments of the present disclosure.
Figure 11:
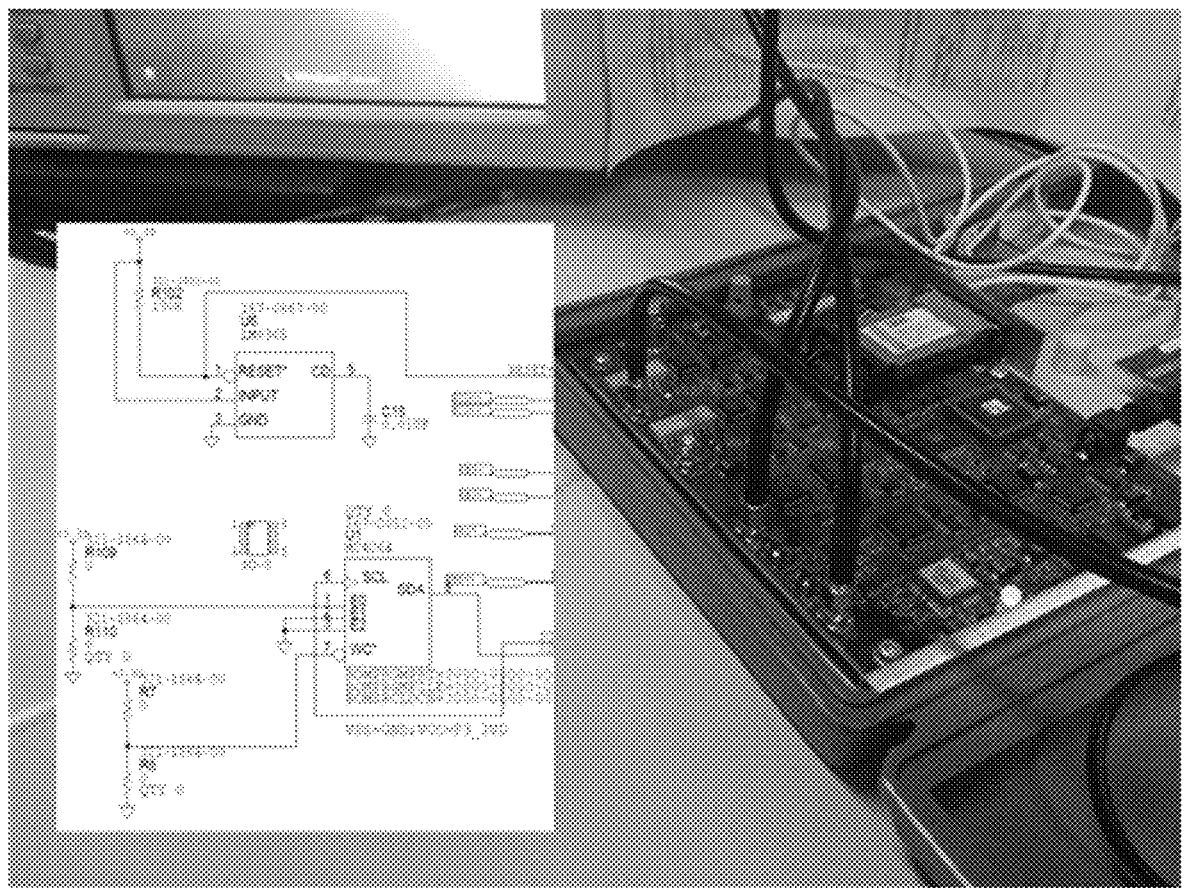
FIG. 11 illustrates a second example of design documents overlaid next to an associated DUT, to enable a user to reference CAD designs while simultaneously viewing the physical DUT, in accordance with various embodiments of the present disclosure.

In certain instances, when physically evaluating or debugging a DUT, engineers often need to reference contextual information for a DUT (e.g., schematics, block diagrams, etc.). In a conventional setting, this requires looking back and forth between the physical DUT and a computer display or hardcopy (e.g., a CAD printout). In the AR environment described herein, the user can be immersed in an environment in which the contextual information is overlaid with the DUT, eliminating the need to look back and forth (see FIG. 10). The contextual information now is seen by the user as a floating virtual display, either 2D or 3D, in a side-by-side fashion with the physical DUT. The ability to change the color of a transparent overlay can negate visibility issues with varying background colors; optionally, an opaque background could also be used to avoid this issue altogether (see FIG. 11). As shown, other information could be virtually overlaid as well as to assist the user.

When testing for electromagnetic interference (EMI) emissions, and collecting test data either in debug or validation phases of a design cycle, a common challenge is repeatability of these tests. In some configurations, the AR environment described herein can be configured to track and record such tests for future reference. This can include locations of the probe with respect to the DUT (e.g., utilizing locational indicia identified within the DUT and/or movement sensors within the probe). When the recording of the test is later referenced (e.g., by user selection of the test via a user interface), the AR environment can be configured to generate a virtual path based on one or more previous tests. The AR environment can then be configured to overlay the virtual path on top of the DUT based on the locational indicia. This can enable the AR environment to effectively, guide a user in replicating the test.

Figure 12:
FIG. 12 illustrates an example of a virtual overlay to guide users in a test cycle (e.g., to repeat past test cycles) while simultaneously viewing the physical DUT, in accordance with various embodiments of the present disclosure.

Such a visualization can assist the user in, for example, guiding where to move a near-field probe in order to repeat a previous test more closely (see FIG. 12). This allows users to see what previously they could not—a previous test path (e.g., EMI test path). The data collected from this could also be submitted as validation data so that standards/approval bodies could repeat or share more exacting pass/failure specifications and data with a company attempting certification of a DUT through the standards/approval bodies. As shown, other information could be virtually overlaid as well to assist the user. This could also be used in environmental chambers, and the collected data could also be used for viewing in an offline analysis (e.g., to compare two or more tests).

Figure 13:
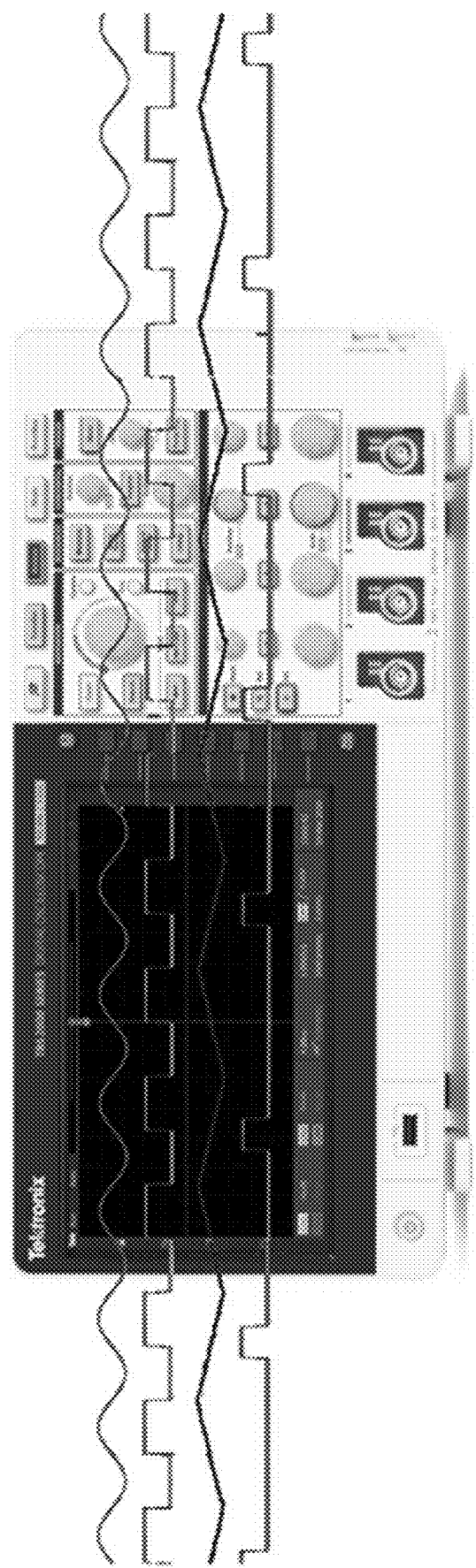
FIG. 13 illustrates an example of a virtual oscilloscope and a virtually infinite screen displayed in an AR Environment, in accordance with various embodiments of the present disclosure.

By sending waveform data into an AR environment there is little practical limit to the screen size of an oscilloscope. This could be considered an "Extended View" or "Virtual Memory" or "Infinite Memory" view of waveform data. That is, given a particular dataset, the waveform presented on screen does not have to stop there—it may continue on and persist moving leftward in the same visual plane of the oscilloscope screen. Likewise, incoming waveform data (earlier in the record) could also be presented to the right of the same visual plane (see FIG. 13). This also opens the door to enhanced AR display options for features such as Pan/Zoom and MagniVu from Tektronix®.

While depicted as being displayed on a virtual oscilloscope, it will be appreciated that such waveform data could be presented without the need to visualize the oscilloscope. To traverse different portions of the waveform, the user could perform any number of tasks, such as, for example, swiping a hand in one direction or the other to cause the waveform to move in accordance with the direction of the swipe; virtually grabbing a portion of the waveform and moving the waveform in either direction via the virtually grabbed portion, turning in one direction or another, walking in one direction or another, or any number of additional interactions.

Figure 14:
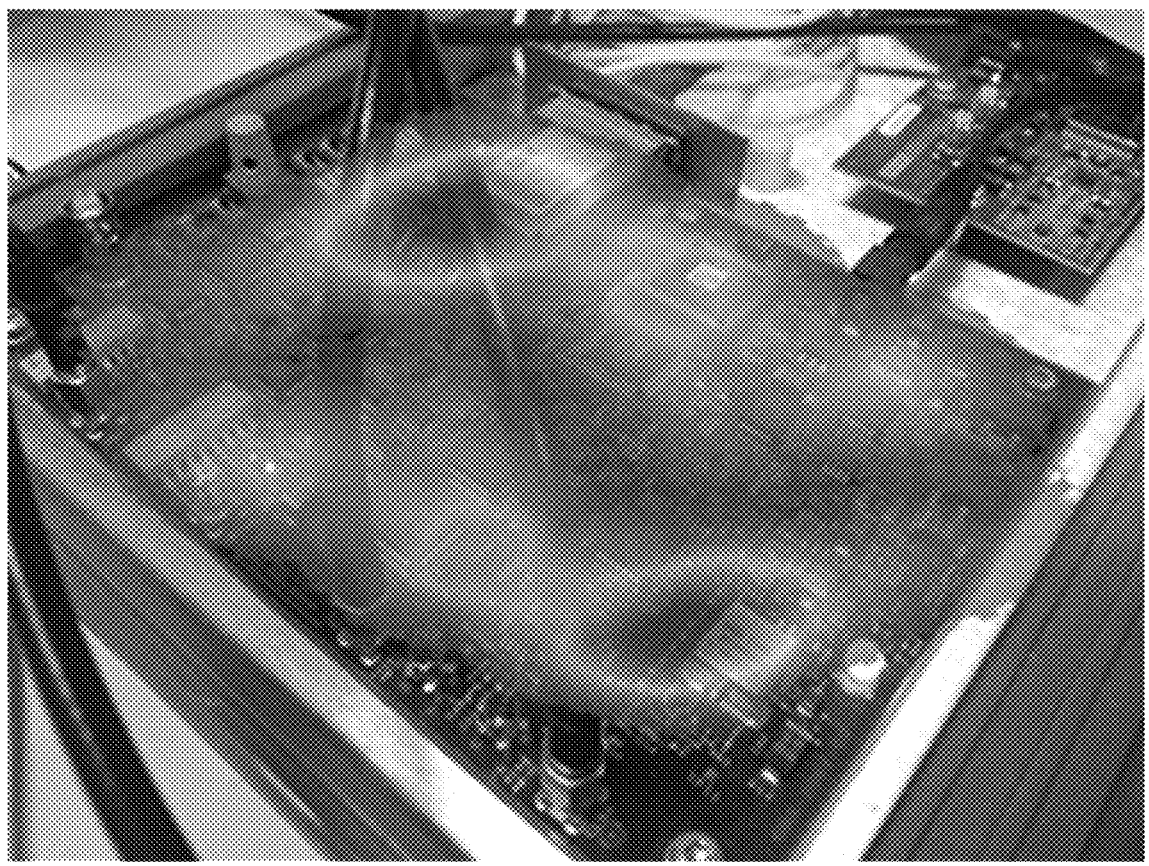
FIG. 14 illustrates an example of a virtual depiction of temperature readings overlaid on a DUT, in accordance with various embodiments of the present disclosure.
Figure 15B:
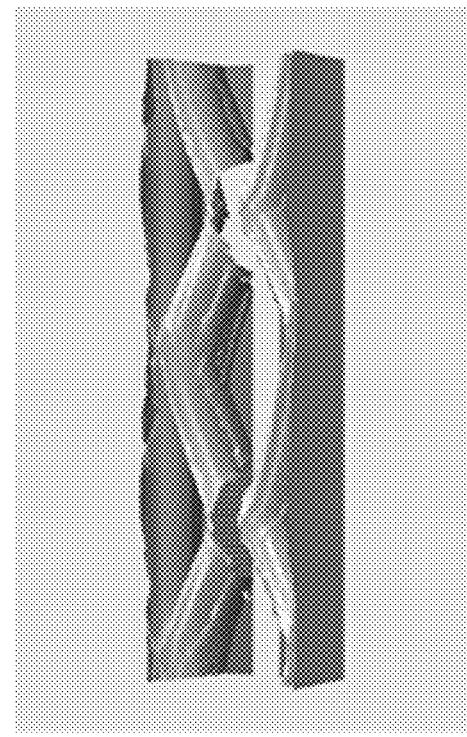
FIG. 15B illustrates a current attempt to show jitter through an eye diagram.
Figure 15A:
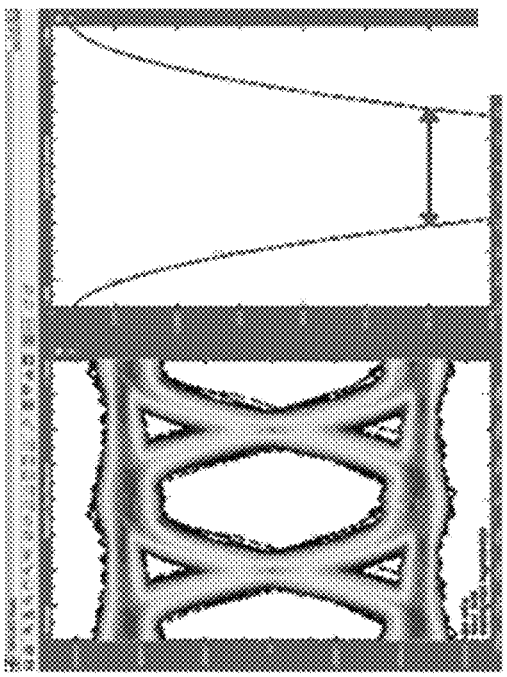
FIG. 15A illustrates a current attempt to show jitter through an eye diagram.
Figure 15E:
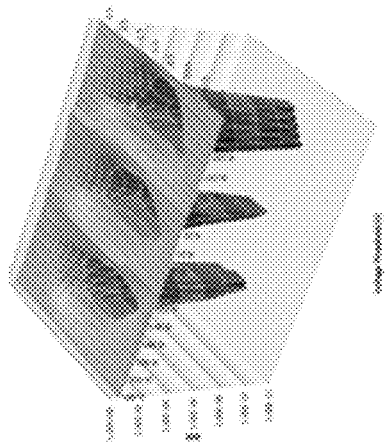
FIG. 15E illustrates a current attempt to show jitter through a bathtub plot.
Figure 15D:
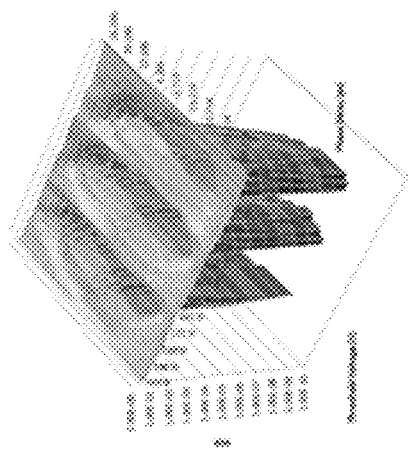
FIG. 15D illustrates a current attempt to show jitter through a bathtub plot.
Figure 15C:
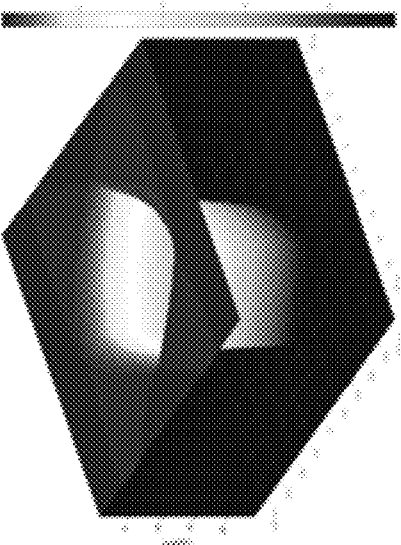
FIG. 15C illustrates a current attempt to show jitter through a plot.

In certain embodiments, the AR environment can be configured to generate temperature data content (collected from sensors) and overlay this content onto an associated DUT in real time for immediate viewing (see FIG. 14). Furthermore, this data can be collected for offline analysis which can then be used to provide a baseline for future testing. This enables regression testing of DUTs as design changes and other modifications are made. Other information could be virtually overlaid as well to assist the user. This technique could also be used in environmental chambers and a wide variety of other test locations.

Figure 16A:
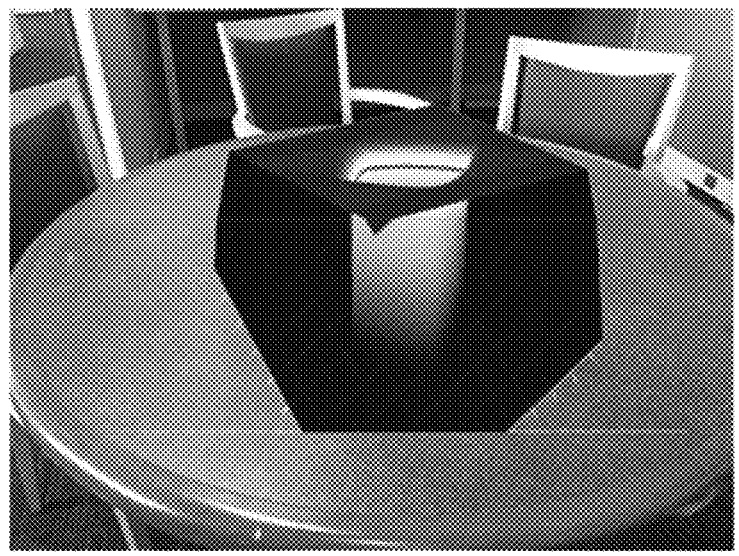
FIG. 16A illustrates an example jitter plot in an AR environment, in accordance with various embodiments of the present disclosure.
Figure 16B:
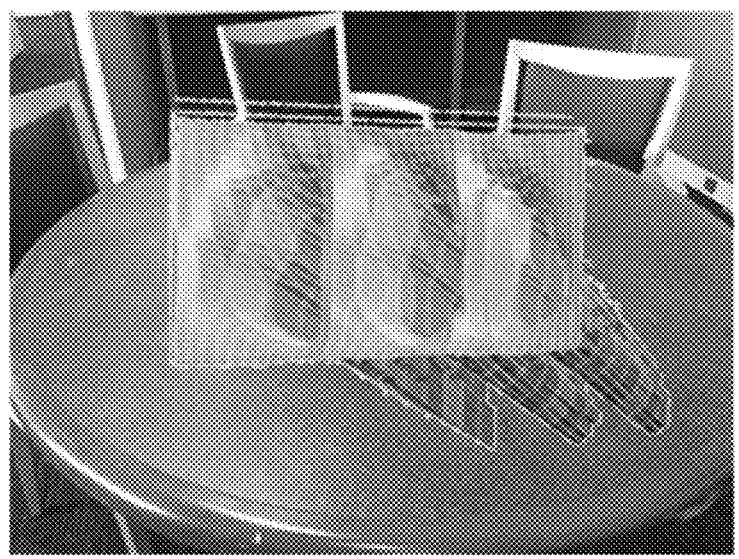
FIG. 16B illustrates an example jitter plot in an AR environment, in accordance with various embodiments of the present disclosure.

In certain embodiments, for extra jitter measurement insights, users can look to 3D representations such as bathtub plots or eye funnels. Currently, these methods are limited to a fixed 2D display. In some instances, the AR environment can be configured to enable users to visually "dive into" and further explore these visuals in an interactive 3D environment. This has the added convenience of making the use of cursors on a 3D bathtub plot more convenient, by enabling the user to manipulate a virtual object of a bathtub plot and place the cursors in a more exact location visually, via virtual movement of the cursors within the physical space (e.g., via hand gestures, HMI, or other control inputs). Providing a true 3D representation via an AR environment ultimately provides a more intuitive presentation of the 3D data users need for their analysis. FIGS. 15A-E illustrate current attempts to show jitter through various eye diagrams and various bathtub plots and FIGS. 16A-B illustrate example jitter plots in an AR environment, in accordance with various embodiments of the present disclosure.

Conventional oscilloscopes may also be limited in terms of the number of channels that can be displayed simultaneously. That is, there is currently no way to display more than the typical 2-8 channels on a single display of a modern oscilloscope, even if the additional channels come from other oscilloscopes connected together. To remedy this, the AR environment can be configured to aggregate channels from multiple oscilloscopes into a single virtual view. Because this can be purely display aggregation, there may be no requirement for the multiple scopes to be synced together to accomplish this. In other configurations, the multiple scopes could be synchronized through any conventional method of synchronization to time-align the signals from the multiple scopes. In embodiments, the AR environment can be configured to provide additional contextual information (e.g., location of the DUT that produced the waveform).

Figure 17:
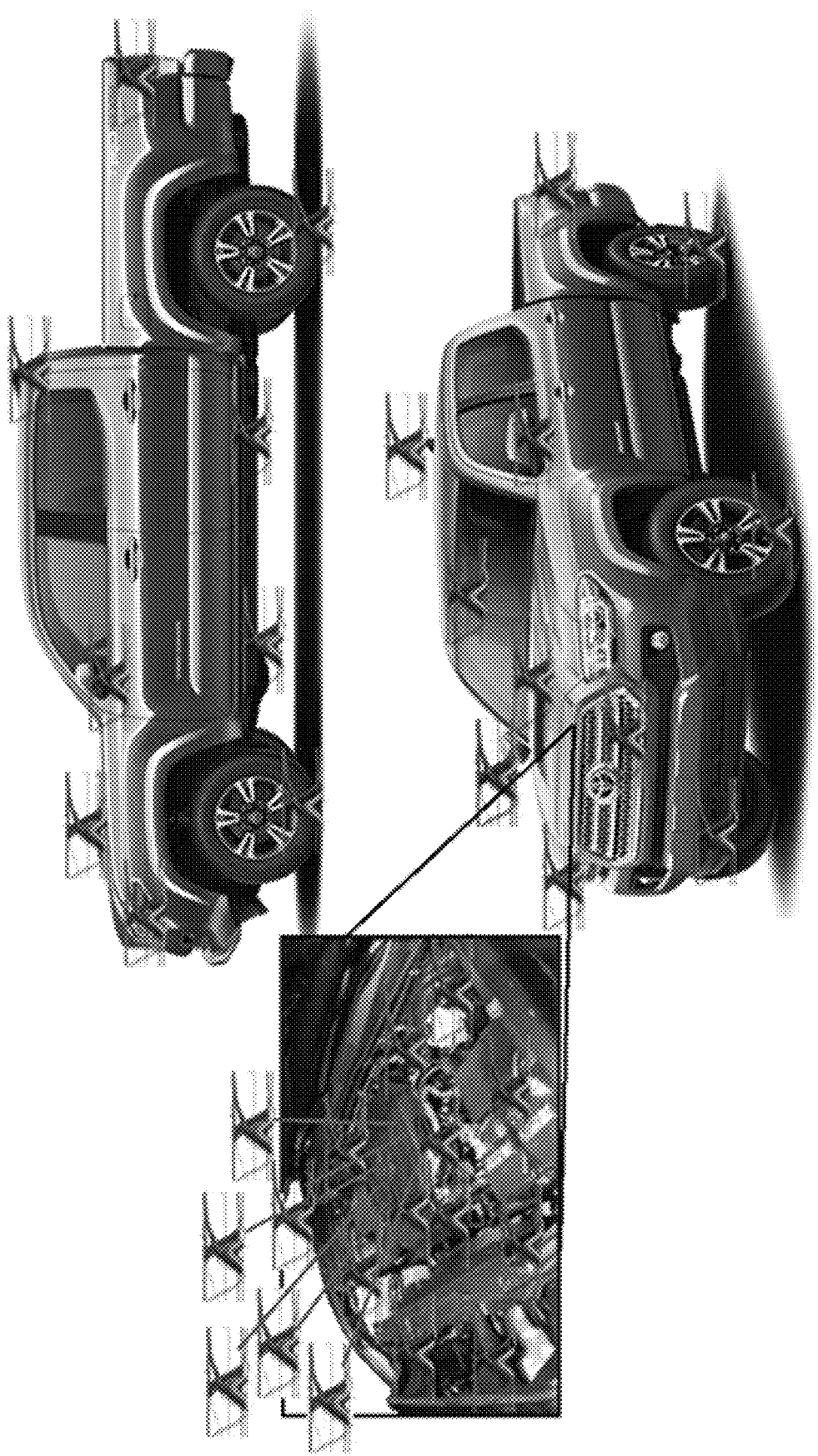
FIG. 17 illustrates an example of an aggregation of outputs from multiple test and measurement devices overlaid on a physical environment, in accordance with various embodiments of the present disclosure.

One example application is the embedded automotive market where numerous sensors and many electrical test points are present (see FIG. 17). As depicted, each waveform is located proximate the DUT, or probe point, that produced the waveform. This can be accomplished by associating each oscilloscope channel, waveform, or DUT with a physical indicia, or other location information, to enable identification of an appropriate location for the overlay of the waveform within the physical environment. In some instances, such as that in the depicted engine bay, the proximity of the waveforms displayed may be such that the waveforms do not all fit at a suitable viewing size without overlapping. In such an embodiment, the AR environment can be configured to generate a breakout line drawn from the identified location of the physical indicia to the associated waveform.

This approach leverages AR to allow customers to leverage their existing install bases or to purchase multiple next-gen scopes and synthesize a higher overall channel count for their applications. The point is that the output of multiple scopes (waveforms) are rerouted together into the AR environment and then viewable in unison by the user (see FIG. 17). Some channel differentiation scheme (e.g., color differentiation, pattern differentiation, etc.) could be implemented to avoid having multiple (but different) channels displayed in an indistinguishable manner. For example, each oscilloscope channel can be assigned a different available color to avoid having multiple channels of the same displayed color, eliminating confusion in the AR environment.

Figure 18:
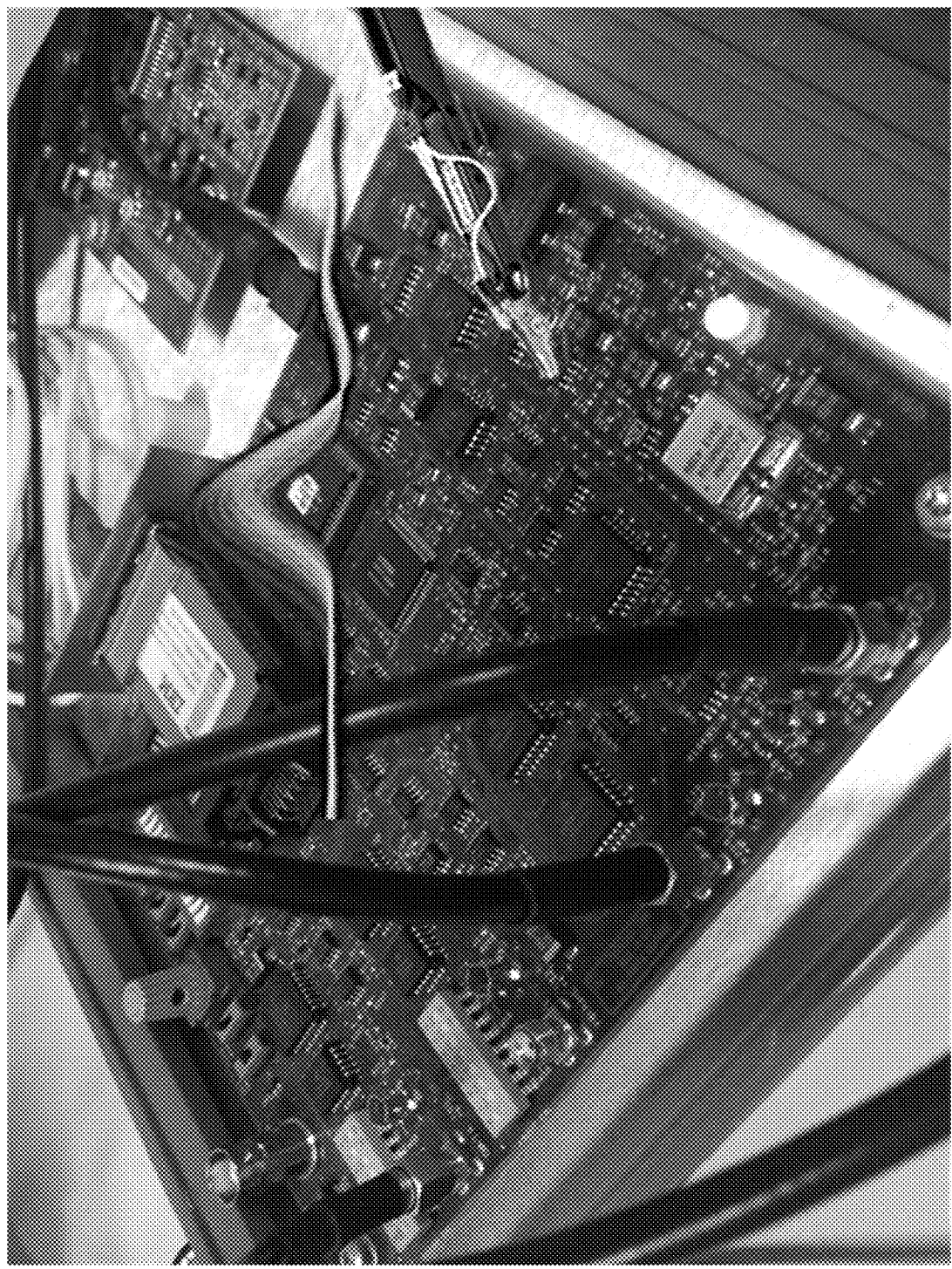
FIG. 18 illustrates an example of a virtual waveform overlaid on a physical DUT, in accordance with various embodiments of the present disclosure.

In certain embodiments, the AR environment can be configured to virtually pair waveform data with a probe (e.g., via physical indicia of the probe). For example, the AR environment can be configured to overlay the virtual representation of the waveform on the circuit board or device under test proximate to the physical location where the signal physically resides as illustrated by FIG. 18. In instances, the AR environment can be configured to enable the user to move the waveform from the DUT to, for example, the user's desk for further analysis, or a conference table for multiple users to observe simultaneously.

In such an AR environment, the user can utilize a head-mounted display to view the waveform in true 3D, as though it were a real physical object in front of them. This represents an unprecedented level of freedom in exploration of Waveform Data, allowing a User or Multiple Users simultaneously to see a virtual Waveform in physical space from underneath, behind, on top of or even from within the Waveform itself. Imagine debugging or qualifying a complex device or circuit and being able to look directly at the probed physical area and see the virtual Waveform floating above the probe in the user's hand.

Figure 19A:
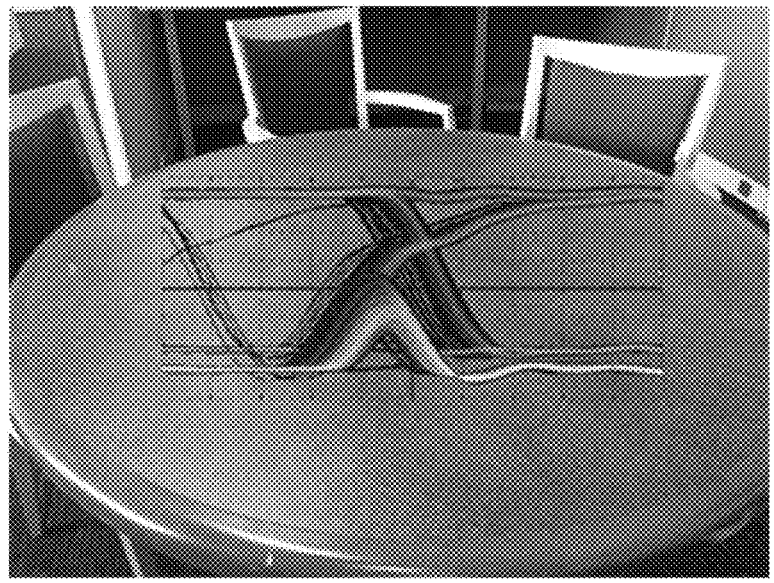
FIG. 19A illustrates an example of remotely viewing waveforms, in accordance with various embodiments of the present disclosure.
Figure 19B:
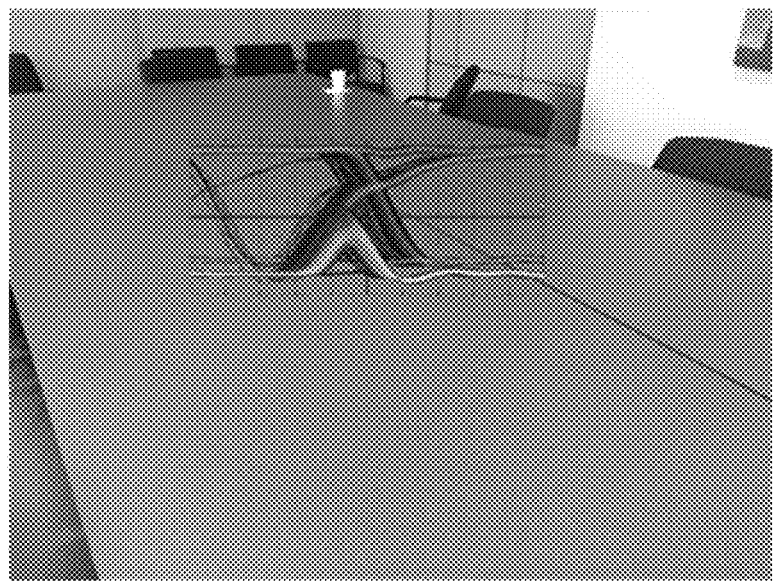
FIG. 19B illustrates an example of remotely viewing waveforms, in accordance with various embodiments of the present disclosure.
Figure 19C:
FIG. 19C illustrates an example of remotely viewing waveforms, in accordance with various embodiments of the present disclosure.

With regard to FIGS. 19A-C, an AR environment can be configured to enable remote viewing of waveform data generated by test and measurement instruments. As used in this context, to "remotely view" waveform data can denote being removed from the physical location of the DUT and/or test and measurement instrument, including if the waveform is offline as previously saved waveform data (such as a reference waveform, or a saved waveform file), or if the waveform data is real-time waveform data from a live feed of a real waveform.

For example, the AR environment can be configured to enable the user to place the virtual representation on the user's desk for further analysis, or on a conference table for multiple users to observe simultaneously for collaboration (e.g., via multiple head-mounted displays where each user is able to view the waveform data from the perspective of the user's location with respect to the waveform data). Graphical elements such as the graticule and other readouts would be optional and user-selectable (e.g., via menus of the AR environment). This remote approach can also be combined with a live local waveform to accomplish a comparison function between the saved/reference waveform and the live local waveform.

By displaying (static) or streaming (dynamic/live) Waveform Data using an AR approach, a User can utilize a head-mounted display to view the Waveform in true 3D, as though it were a real physical object in front of them in the physical space. This represents an unprecedented level of freedom in exploration of Waveform Data, allowing a user or Multiple users to simultaneously see a virtual waveform in physical space from underneath, behind, on top of or even from within the Waveform itself.

In certain situations, when testing DUTs operating in the Radio Frequency (RF) domain, designers can resort to an archaic and tedious process of tabulating readings in a spreadsheet. This typically includes logging physical location information in a meaningful way, such as by component number, net reference, etc. As such, the designer may constantly be switching between taking a reading and recording the reading in the spreadsheet. To remedy this, the AR environment can be configured to enable RF data collection tests to be tracked, correlated with a physical location on the DUT, and plotted in real time for immediate viewing or for future reference offline.

Figure 20:
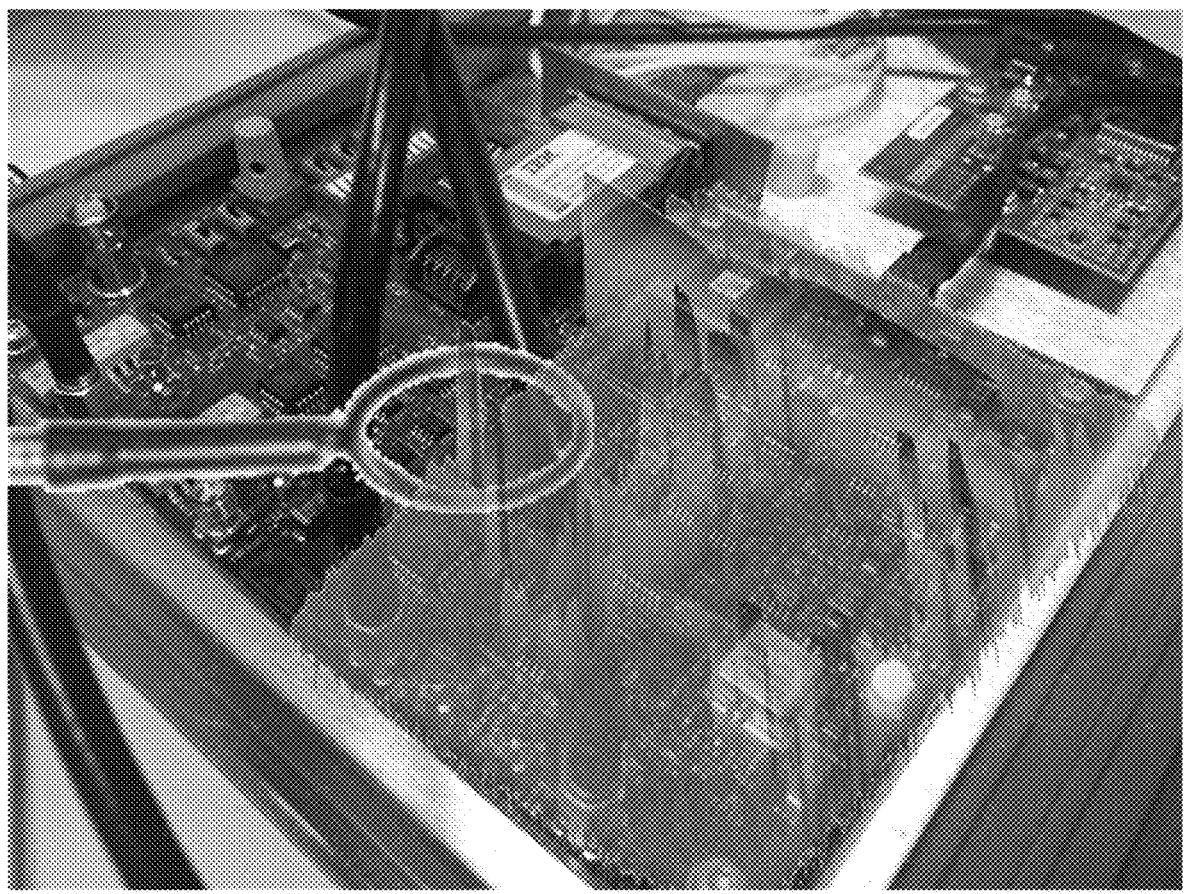
FIG. 20 illustrates an example of a virtual overlay of RF readings generated from probing the DUT and while simultaneously viewing the physical DUT, in accordance with various embodiments of the present disclosure.

As a designer or tester commences a test and guides an RF probe across the DUT, the AR environment can be configured to track positional information of the RF probe (e.g., via physical indicia, or other suitable positional tracking information) in reference to the DUT and to record a 3D plot of the RF spectrum readings. The AR environment can then be configured to plot the RF spectrum readings as an overlay on the DUT (see FIG. 20). By overlaying the RF spectrum readings on the DUT, the spectrum readings are presented in a context that isn't possible in a conventional test and measurement environment.

Compared to tedious manual spreadsheet logging, this highly-automated application fills a technological gap, allowing users to see what previously they could not—a true-to-physical-location plot of the RF readings emitted near the DUT. Furthermore, this data can be collected for offline analysis which can then be used to provide a baseline for future testing. This enables regression testing of DUTs as design changes and other modifications are made. Other information could be virtually overlaid as well to assist the user. This technique could also be used in environmental chambers and a wide variety of other test locations.

Figure 21A:
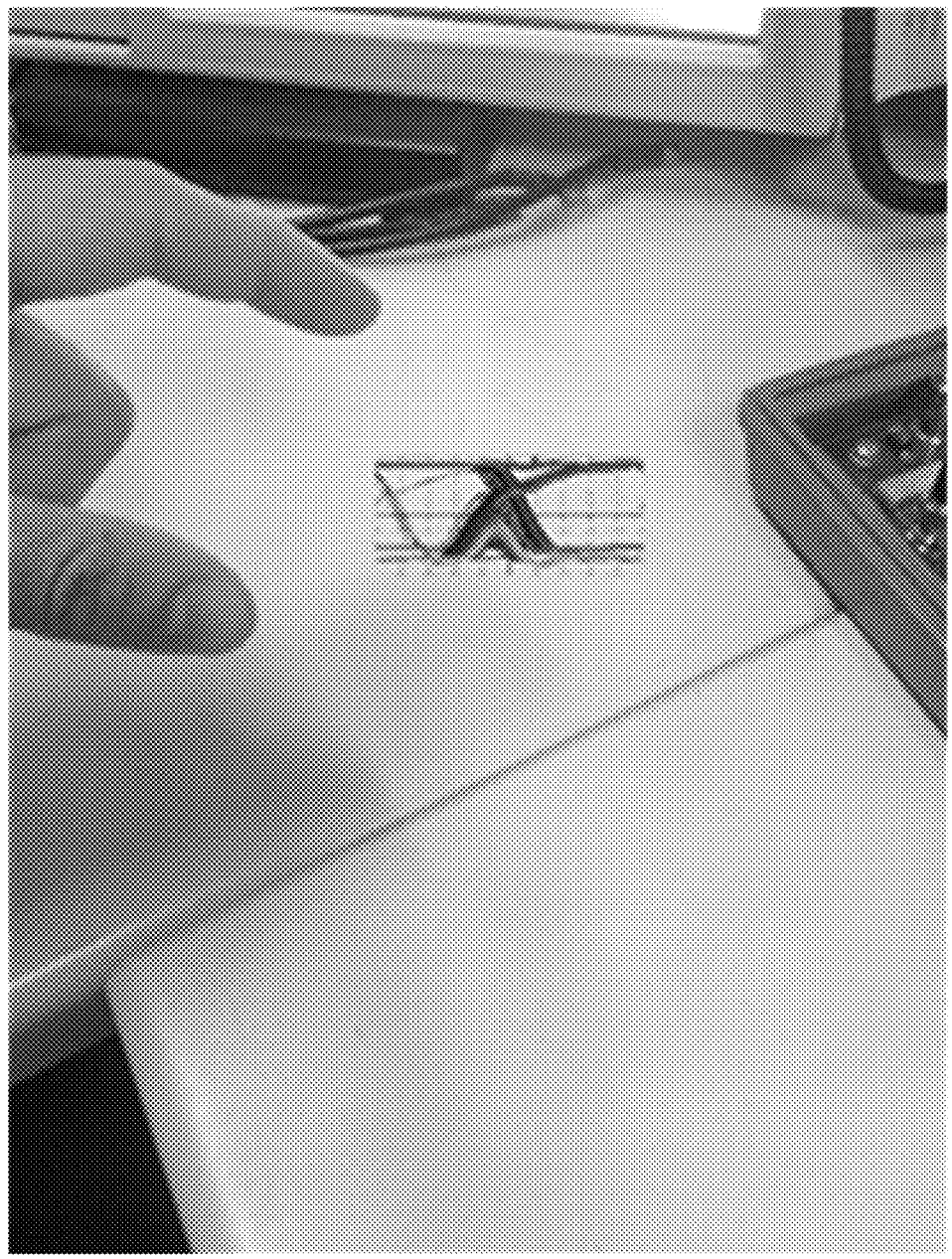
FIG. 21A illustrates an example of manipulation (e.g., via gestures) of virtual data presented in an AR environment, in accordance with various embodiments disclosed herein.
Figure 21B:
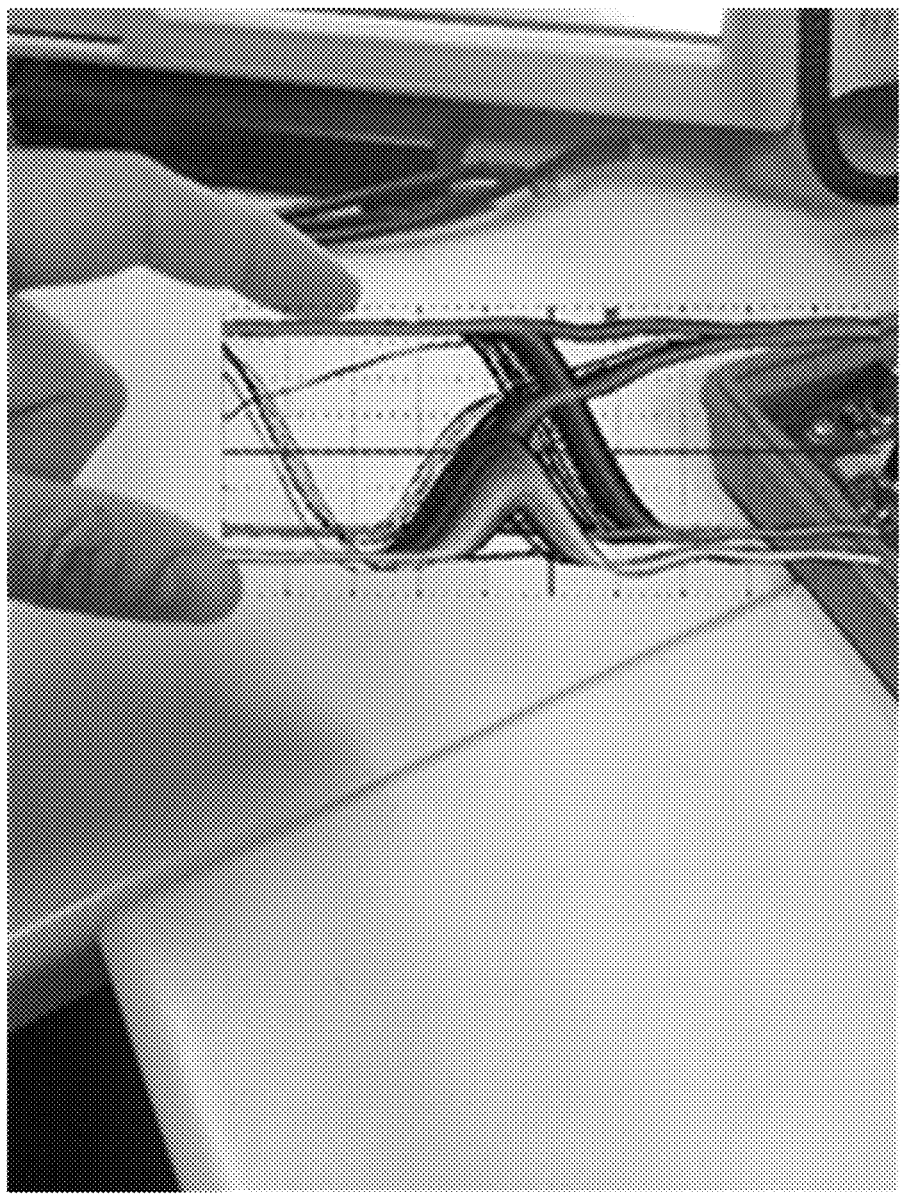
FIG. 21B illustrates an example of manipulation (e.g., via gestures) of virtual data presented in an AR environment, in accordance with various embodiments disclosed herein.
Figure 21C:
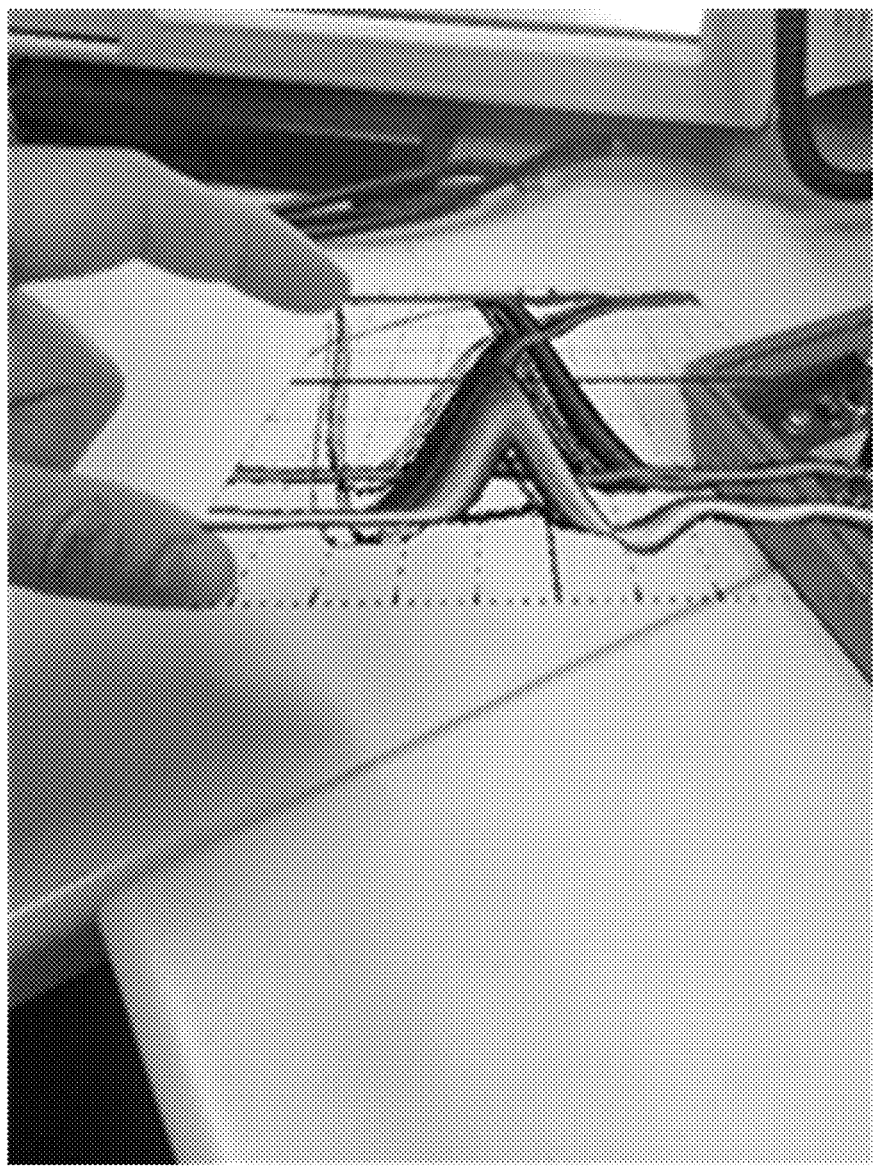
FIG. 21C illustrates an example of manipulation (e.g., via gestures) of virtual data presented in an AR environment, in accordance with various embodiments disclosed herein.
Figure 21D:
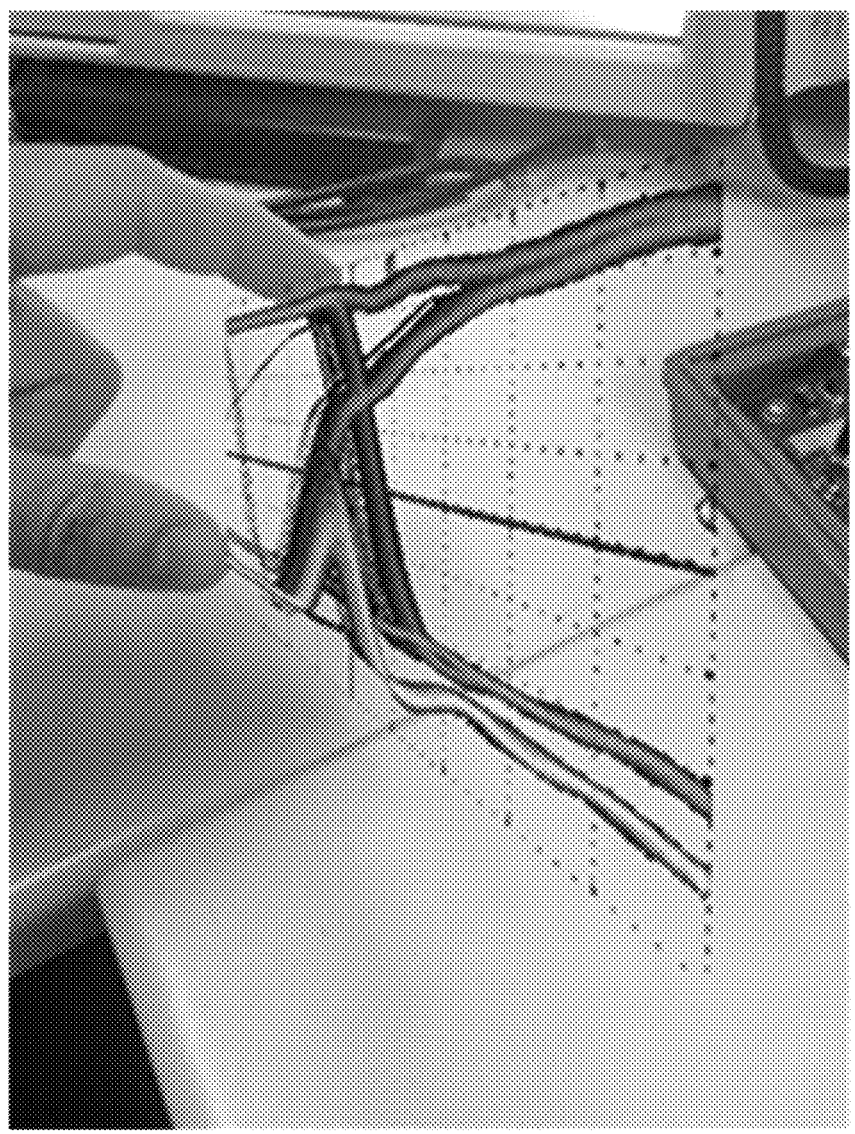
FIG. 21D illustrates an example of manipulation (e.g., via gestures) of virtual data presented in an AR environment, in accordance with various embodiments disclosed herein.
Figure 21E:
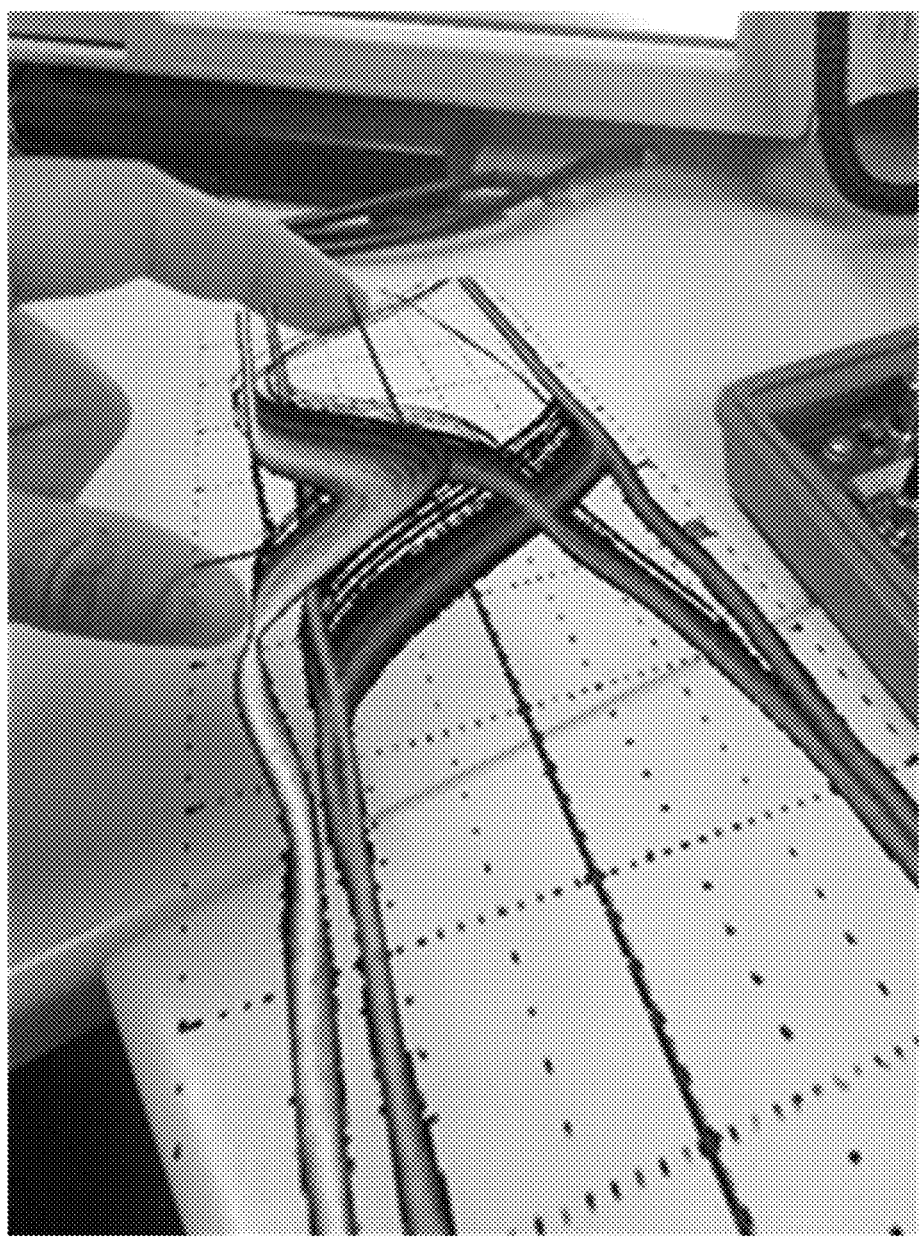
FIG. 21E illustrates an example of manipulation (e.g., via gestures) of virtual data presented in an AR environment, in accordance with various embodiments disclosed herein.
Figure 21F:
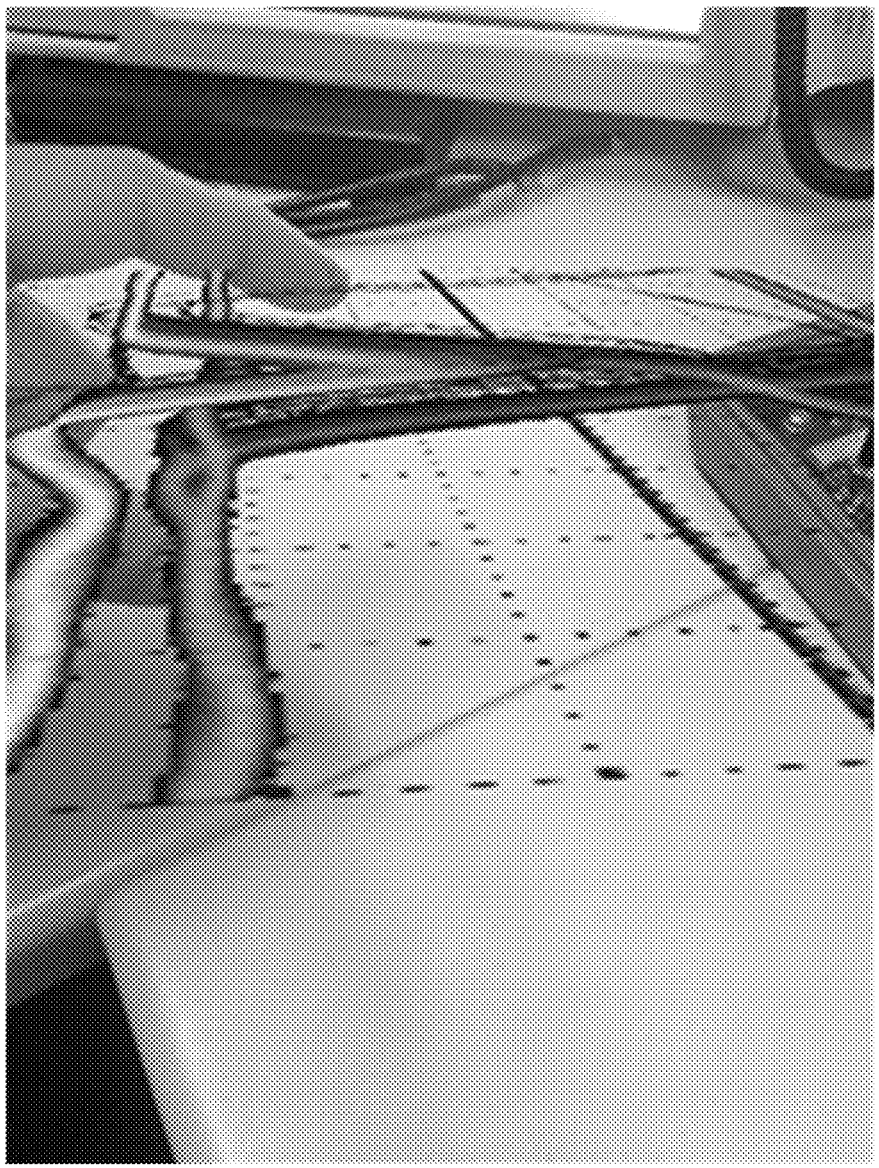
FIG. 21F illustrates an example of manipulation (e.g., via gestures) of virtual data presented in an AR environment, in accordance with various embodiments disclosed herein.

One aspect of an AR environment is the ability to manipulate the display of the 2D or 3D virtual content. As such, the AR environment can be configured to enable virtual manipulation of waveform data using either a human machine interface (HMI, such as a remote, or other controller input), or directly with the hands based on heuristics or gestures. This includes, but is not limited to, actions such as scaling, rotating, roll, yaw, pitch, and virtual movement/placement of the overlay in the virtual environment (see FIGS. 21A-D). As such, the display capabilities of the AR environment can far exceed what can be observed from the waveform data when limited to a fixed 2D display of a conventional test and measurement instrument (see FIGS. 21E-F). Graphical elements such as the graticule and other readouts could be optional in the AR environment and user-selectable via menus of the AR environment.

By displaying (referring to static display in this instance) or streaming (referring to dynamic/live display) waveform data using an AR, a User can utilize a head mounted display to view the waveform data in true 3D, as though it were a real three-dimensional physical object in front of them. This represents an unprecedented level of freedom in exploration of waveform Data, allowing a User, or Multiple Users simultaneously, to see a virtual representation of waveform data in physical space from underneath, behind, on top of or even from within the waveform itself.

Oscilloscopes, limited by fixed 2D displays, have in the past attempted to convey extra dimensions of data. For example RF Spectrum Analyzers and Mixed-Domain (RF-capable) Oscilloscopes may include a view (e.g., Spectrum View from Tektronix®), where RF traces can be stacked over time—however, even in Spectrum View the display and therefore the data is still limited to two dimensions. Bringing analog, digital, and RF signals into the 3D space opens up new opportunities for added test and measurement insights.

Figure 22:
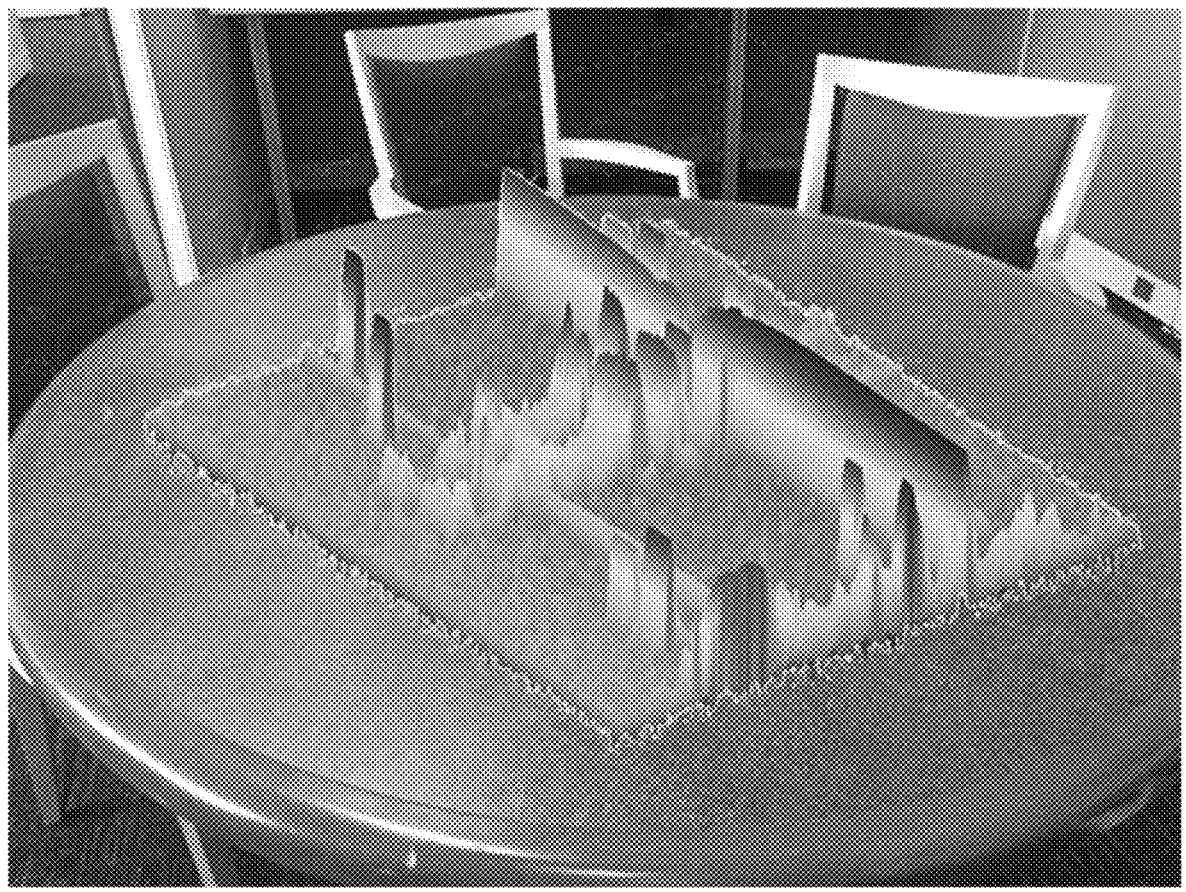
FIG. 22 illustrates an example of a virtual three-dimensional object representing analog/digital/RF waveforms which provide an enhanced immersive view, in accordance with various embodiments of the present disclosure.

An AR environment can be configured to stack time-varying information of waveforms into a third dimension (see FIG. 22), which can be viewed for an enhanced view of the signal data. This may include qualities such as phase, jitter, real points versus imaginary points, and constellation data. Furthermore, the AR environment can be configured to generate 3D histograms or 3D X-Y graphs that can be mined for extra insights via interaction (e.g., via gestures) with these 3D histograms or 3D X-Y graphs in the 3D physical space. Additionally, the AR environment can be configured to generate topographical maps of signals and enable exploration of 3D persistence of waveforms.

In further embodiments the AR environment can be configured to accomplish a number of other tasks. For example, physical oscilloscope screen space may be maximized by moving multiple waveforms and/or graphical user interface (GUI) windows out of the oscilloscope physical screen and into a space outside of the oscilloscope. Another example is the true 3D display of 3D histograms in which the waveform grows and shifts in all three dimensions over time. Another example are classes of measurements based on true 3D waveform data parsed into individual samples or groups of samples only approachable in virtual 3D space.

To enable interaction with the test and measurement device, a visual interface that is capable of monitoring for two dimensional or three-dimensional gesture based input for a test and measurement device is also disclosed herein. Such input could be captured by any number of devices, or combinations of devices, such as one or more cameras, infrared sensors, laser sensors, motion sensors including contact motion sensors (e.g., gloves with movement sensors) or non-contact motion sensors, etc. It will be appreciated that the embodiments disclosed herein are not to be limited by the manner in which the gestures are captured and that any gesture capture mechanism is contemplated. By enabling a user of a test and measurement instrument to interact with the test and measurement instrument in a while being remote from the test and measurement instrument, this disclosure enables the ability to control the test and measurement instrument while physically isolated from the machine. In some instances this can enable control of the test and measurement instrument in possibly dangerous scenarios, such as high voltage scenarios, or in scenarios where interaction of the user with the test and measurement instrument could impact results of the test. In some instances, this disclosure can also enable a user to control the test and measurement instrument through transparent isolation, like a window of an isolation chamber or thermal chamber. As such, the user can control the test and measurement instrument in an environment that may be inhospitable or dangerous to a person. In other instances, aspects of this disclosure can be implemented in an augmented reality environment, such as that described herein, to enable a user to control the test and measurement instrument while immersed in an augmented reality experience.

By using gestures, there are no restrictions on the size of the device being used to support the interface and any device being used to support the interface would only need to implement a gesture capture mechanism, such as those illustrative examples described above, in addition to a gesture interpretation module. A gesture interpretation module can be configured to detect and interpret the gesture from data provided by the gesture capture mechanism and to correlate the gesture with a command signal to provide to the test and measurement instrument to effectuate a command associated with the gesture. In some instances, this can involve fairly simple edge detection based gesture recognition and access to an interface of the test and measurement instrument. In some instances, the gesture capture mechanism and the gesture interpretation module can be integrated with the test and measurement instrument, in other instances the gesture capture mechanism and/or the gesture interpretation module can be external or remote from the test and measurement instrument.

Unique gestures, or sequences of gestures, can be utilized to access and manipulate various subsystems. For example, a starting gesture could be used to identify a subsystem and then other gestures could be used to carry out tasks within that subsystem. As such, tasks in different subsystems can be associated with the same gesture, however, because the context (e.g., subsystem) is different the same gesture can effectuate different tasks. Additional details are described in more detail below.

By using gesture based interfaces, the test and measurement instrument can be controlled without physical or electrical connectivity. This can open up the possibility for more sensitive measurements as well as controlling instruments in hazardous environments. In addition, by using a new form of interface, it also expands the possible controls that beyond that which is currently available.

By using a gesture based interfaces, the limitations of a physical access to the test and measurement instrument or a remote input device are avoided. By allowing a user to interactively control the instrument, there is a lower need for upfront knowledge for programmatically controlling an instrument remotely. In addition, in embodiments using a visual method, interference from the noise within a testing environment is mitigated.

Figure 23:
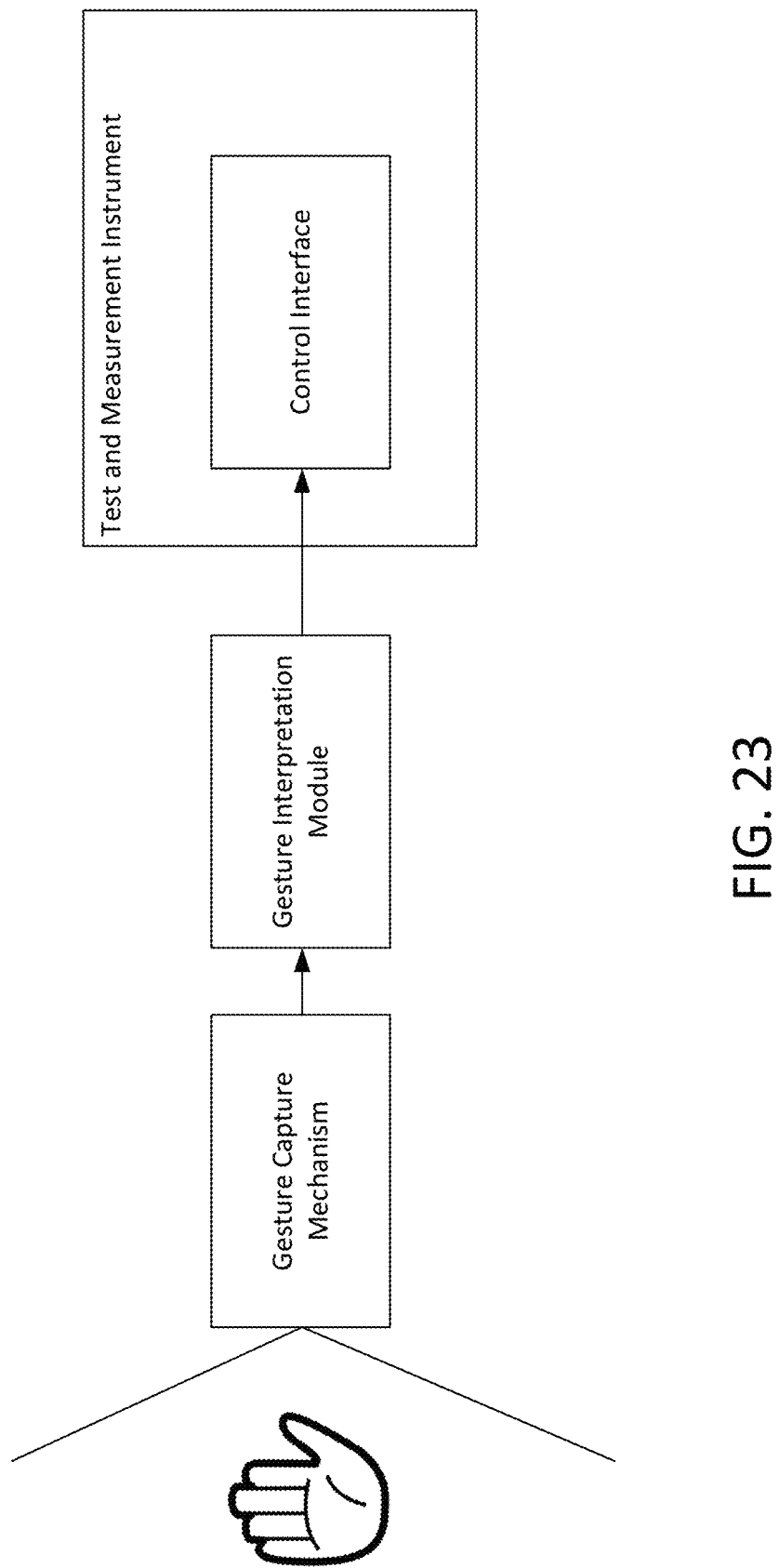
FIG. 23 is a schematic diagram of a system for gesture based interaction with a test and measurement instrument.

In some configuration, this disclosure combines physical gestures, a gesture capture mechanism, a gesture interpretation module, and a test and measurement instrument including a command interface to provide a non-contact based method for controlling the test and measurement instrument. FIG. 23 identifies illustrative components for such a system.

The system provided by this disclosure uses gestures observed by gesture capture mechanism, connected with gesture interpretation module to interpret the gestures as specific commands that can then be conveyed to the test and measurement instrument via a command interface of the test and measurement instrument. The gesture interpretation could be achieved, in some embodiments, by simple edge detection and tracking mechanisms or more sophisticated methods.

The gesture interpretation module would identify the gesture and translate it into a command step request. These command steps could be routed to the piece of test and measurement device instrument through an internal or external interface. The test and measurement instrument, or any other component, could then provide feedback to the user that the gesture was recognized. In an alternative embodiment, the gesture interpretation module could build up a graphical or alphanumeric representation of the command sequence to allow the user to confirm the command sequence and then use another gesture to initiate the command and send it to the control interface of the test and measurement instrument.

The gestures can be achieved in any number of ways such as, for example, by a combination of linear or circular movements that could be tracked by the gesture capture mechanism. The gestures could be interpreted in a sequence to provide a complete command to the test and measurement instrument. General gestures could include (but are not limited to) single hand movement in a linear fashion (horizontally, vertically or diagonally), single hand movement in a circular motion (clockwise, anti-clockwise) multiple hand movement where they are moving relative to each other (separating, or coming together in a vertical, horizontal or diagonal line), individual or combined finger movement, movement of any other portion of the body, or movement of an inanimate object associated with the gesture.

The command structure could be achieved by using a unique initiation gesture first, to identify the desired set of commands to access, followed by one of a set of gestures indicating the next step in the command sequence. Command gestures could be repeated as the command sequence is built up. The command sequence may be potently recursive as needed to support nested commands, like menu selections.

The following is a basic set of gestures from which the command set could be composed of:

Singe hand moving horizontally from left to right—with the hand being oriented perpendicular to direction of movement for easiest detection.
Single hand moving horizontally from right to left—with the hand being oriented perpendicular to direction of movement for easiest detection.
Single hand moving vertically downward—with the hand being oriented perpendicular to direction of movement for easiest detection.
Single hand moving vertically upward—with the hand being oriented perpendicular to direction of movement for easiest detection.
Singe hand movement diagonally from upper right to lower left—with the hand being oriented perpendicular to direction of movement for easiest detection.
Singe hand movement diagonally from lower right to upper left—with the hand being oriented perpendicular to direction of movement for easiest detection.
Single hand movement diagonally from upper left to lower right—with the hand being oriented perpendicular to direction of movement for easiest detection.
Single hand movement diagonally from lower left to upper right—with the hand being oriented perpendicular to direction of movement for easiest detection.
Single hand moving in a circle clockwise.
Single hand moving in a circle anti-clockwise.
Two hands moving apart in a horizontal direction—with the hands being oriented perpendicular to direction of movement for easiest detection.
Two hands moving apart in a vertical direction—with the hands being oriented perpendicular to direction of movement for easiest detection.
Two hands moving apart in a diagonal direction toward upper left and lower right—with the hands being oriented perpendicular to direction of movement for easiest detection.
Two hands moving apart in a diagonal direction toward lower left and upper right—with the hands being oriented perpendicular to direction of movement for easiest detection.
Two hands moving toward each other in a horizontal direction—with the hands being oriented perpendicular to direction of movement for easiest detection.
Two hands moving toward each other in a vertical direction—with the hands being oriented perpendicular to direction of movement for easiest detection.
Two hands moving toward each other in a diagonal direction from the upper left and lower right—with the hands being oriented perpendicular to direction of movement for easiest detection.
Two hands moving toward each other in a diagonal direction from the lower left and upper right—with the hands being oriented perpendicular to direction of movement for easiest detection.

There are other possibilities due to combining these into a single gesture to form stylized alphabetic characters.

Here are some examples of gesture sequences and what they might represent for a piece of test equipment. It is not intended to be exhaustive or complete.

Enter horizontal time base control—single hand moving left to right (or any other suitable gesture)
Time base control active:
  Two hands moving apart horizontally—expand the time base, less time per division.
  Two hands moving together horizontally—contract the time base, more time per division.
  Single hand moving left to right—scroll display window to a later position in the trace display.
  Single hand moving right to left—scroll display window to an earlier in the trace display.
  Single hand moving vertically upward—exit the time base control mode.
Enter vertical sensitivity for active channel—single hand moving vertically upward (or any other suitable gesture).
Vertical channel control active:
  Two hands moving apart vertically—increase channel sensitivity, smaller volts per division.
  Two hands moving together vertically—decrease channel sensitivity, larger volts per division.
  Single hand moving vertically upward—move ground reference upward on the display.
  Single hand moving vertically downward—move ground reference downward on the display.
  Single hand moving left to right horizontally—exit the vertical channel control mode.
Enter trigger mode control—single hand moving diagonally from lower left to upper right (or any other suitable gesture).
Trigger mode control active:
  Single hand moving vertically upward—raise the trigger level.
  Single hand moving vertically downward—lower the trigger level.
  Single hand moving horizontally left to right—move the trigger point later in the trace.
  Single hand moving horizontally right to left—move the trigger point earlier in the trace.
  Single hand moving diagonally from upper left to lower right—switch triggering mode.
  Single hand moving in a circle clockwise—enter the channel select mode. In this mode the selected channel will automatically deselect the previous trigger channel. Use the rules below for operating in this mode.
  Single hand moving diagonally from upper right to lower left—exit the trigger mode.
Enter Select channel mode—Single hand moving in a circle clockwise (or any other suitable gesture).
Select channel mode active:
  Single hand moving vertically downward—move to the next channel in the instrument.
  Single hand moving vertically upward—move to the previous channel in the instrument.
  Single hand moving horizontally left to right—turn on the selected channel.
  Single hand moving horizontally right to left—turn off the selected channel.
  Single hand moving in a circle anti-clockwise—exit the channel select mode.
Enter cursor control mode—Single hand moving diagonally upper left to lower right (or any other suitable gesture).
Cursor control mode active:
  Single hand moving in a circle clockwise—enter the channel select mode. Use the rules below for operating in this mode to select the channel to apply the cursors to.
  Single hand moving diagonally upper left to lower right—toggle cursors between vertical to horizontal mode.
  Single hand moving diagonally lower left to upper right—toggles the active cursor.

Single hand moving horizontally left to right—move active cursor later on the waveform.

Single hand moving horizontally right to left—move the active cursor earlier on the waveform.

Single hand moving vertically upward—move the active cursor in a positive direction in the waveform.

Single hand moving vertically downward—move the active cursor in a negative direction on the waveform.

Single hand moving diagonally from lower right to upper left—exit cursor control mode.

Enter generic menu mode—Single hand moving in a circle anti-clockwise

Menu active:

Single hand moving vertically upward/downward—scroll up/down the menu.

Single hand moving horizontally left to right—select current menu choice to activate the choice or open a sub-menu.

Single hand moving horizontally right to left—exit the menu or active sub-menu.

In an integrated solution the gesture capture mechanism, gesture interpretation module and the test and measurement instrument and associated could all be a single unit. A remote unit could be implemented with something as simple as a smart phone that uses the camera with an application that interprets the gestures and issues commands to the instrument. The application could also provide feedback to the user on the screen (e.g., identifiers of commands, sequence of commands, etc.

EXAMPLES

Illustrative examples of the technologies disclosed herein are provided below. An embodiment of the technologies may include any one or more, and any combination of, the examples described below.

Example 1 is directed to a test and measurement system comprising a data store configured to store augmentation settings for dynamically augmenting a physical testing environment; and a computing device coupled to the data store, the computing device configured to receive an input feed from the physical testing environment, create an augmentation image based on the augmentation settings and the input feed, and output the augmentation image to be overlaid on the physical testing environment to augment a user's view of the physical testing environment.

Example 2 includes the subject matter of example 1, further comprising a display device configured to visually present the augmented image overlaid on the physical testing environment to the user.

Example 3 includes the subject matter of example 2, wherein the display device is a head-mounted display, a tablet device, an image display screen, or a display of a mobile phone.

Example 4 includes the subject matter of any of examples 1-3, further comprising a camera configured to provide the input feed.

Example 5 includes the subject matter of example 4, wherein the camera is integrated into the display device.

Example 6 includes the subject matter of example 2, wherein the display device is at least partially transparent.

Example 7 includes the subject matter of any of examples 1-6, wherein the augmented image comprises content captured by a camera coupled with a measurement probe.

Example 8 includes the subject matter of any of examples 1-7, wherein the augmentation image comprises a generated waveform related to a device under test in the physical testing environment.

Example 9 includes the subject matter of any of examples 1-8, wherein the augmentation image comprises a virtual user interface.

Example 10 includes the subject matter of example 9, wherein the virtual user interface comprises instructions to a user.

Example 11 includes the subject matter of example 10, wherein the instructions comprise an indication of an area to be tested or an area to be avoided.

Example 12 includes the subject matter of any of examples 10-11, further comprising an input device, wherein the computing device is further configured to make changes to the instructions responsive to input received from the user by way of the input device.

Example 13 includes the subject matter of any of examples 1-12, further comprising an input device, wherein the computing device is further configured to make changes to the augmentation image responsive to input received from the user by way of the input device.

Example 14 includes the subject matter of example 7, wherein the computing device is further configured to place a virtual marker within the augmentation image responsive to the user causing the measurement probe to make physical contact with a certain portion within the physical testing environment, the virtual marker corresponding to an identified location of the certain portion.

Example 15 includes the subject matter of any of examples 1-14, wherein the augmentation settings are configurable to allow the user to select a locational position for the augmented image within the display device.

Example 16 is directed to a machine-controlled method comprising, using a data store, storing augmentation settings for dynamically augmenting a physical testing environment, receiving an input feed from the physical testing environment, using a computing device, creating an augmentation image based on the augmentation settings and the input feed, and outputting the augmented image to be overlaid on the physical testing environment to augment a user's view of the physical testing environment.

Example 17 is directed to one or more computer-readable storage media comprising instructions, which, when executed by a processor, cause the processor to receive, from a data store, augmentation settings for dynamically augmenting a physical testing environment, receive an input feed from the physical testing environment, generate an augmentation image based on the augmentation settings and the input feed, and output the augmentation image to be overlaid on the physical testing environment to augment a user's view of the physical testing environment.

Example 18 includes the subject matter of example 17, wherein the augmented image comprises content captured by a camera coupled with a measurement probe, a generated waveform related to a device under test in the physical testing environment.

Example 19 includes the subject matter of any of examples 17-18, wherein the augmented image comprises a virtual user interface that includes directions to a user, the directions comprising an indication of an area to be tested or an area to be avoided.

Example 20 is directed to a test and measurement system comprising a device under test (DUT), a data store configured to store augmentation settings for dynamically augmenting a physical testing environment, a head-mounted display device configured to be worn by a user, a measurement probe configured to interact with the DUT, a probe camera coupled to the measurement probe, and a computing device coupled to the data store, the computing device configured to receive an input feed from the physical testing environment, receive an image captured by the camera coupled with the measurement probe, create an augmentation image based on the augmentation settings, the input feed, and the image captured by the probe camera, and cause the head-mounted display device to visually present the augmented image overlaid on the physical testing environment to a user.

Aspects of the invention may operate on a particularly created hardware, on firmware, digital signal processors, or on a specially programmed computer including a processor operating according to programmed instructions which may be stored in one or more instances of memory or on one or more computer-readable media. The terms controller or processor as used herein are intended to include microprocessors, microcomputers, Application Specific Integrated Circuits (ASICs), and dedicated hardware controllers. One or more aspects of the invention may be embodied in computer-usable data and computer-executable instructions, such as in one or more program modules, executed by one or more computers, or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the invention, and such data structures are contemplated within the scope of computer executable instructions and computer-usable data described herein.

The aspects of the present disclosure are susceptible to various modifications and alternative forms. Specific aspects have been shown by way of example in the drawings and are described in detail herein above. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media. Computer storage media means any medium that can be used to store computer-readable information. By way of example, and not limitation, computer storage media may include random access memory (RAM), read-only memory (ROM), electrically erasable programmable read-only memory (EEPROM), flash memory or other memory technology, compact disk read-only memory (CD-ROM), digital video disk (DVD) or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, radio frequency (RF), infrared, acoustic or other types of signals.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A test and measurement system, comprising:
one or more processors, the one or more processors configured to:
receive augmentation settings for dynamically augmenting a physical testing environment;
receive an input feed from the physical testing environment;
create virtual or augmented content based on either or both of the augmentation settings and the input feed; and
overlay the virtual or augmented content on an image or video of the physical testing environment to augment a user's view of the physical testing environment.

2. The test and measurement system according to claim 1, further comprising a display device configured to visually present the virtual or augmented content overlaid on the physical testing environment to the user.

3. The test and measurement system according to claim 2, wherein the display device is a head-mounted display, a tablet device, an image display screen, or a display of a mobile phone.

4. The test and measurement system according to claim 2, wherein the display device comprises an integrated camera configured to provide the input feed.

5. The test and measurement system according to claim 2, wherein the display device is at least partially transparent.

6. The test and measurement system according to claim 1, further comprising a camera configured to provide the input feed.

7. The test and measurement system according to claim 1, further comprising a measurement probe, wherein the measurement probe comprises an integrated camera configured to provide the input feed.

8. The test and measurement system according to claim 1, wherein the virtual or augmented content comprises a generated waveform related to a device under test in the physical testing environment.

9. The test and measurement system according to claim 1, wherein the virtual or augmented content comprises a virtual user interface.

10. The test and measurement system according to claim 9, wherein the virtual user interface comprises instructions to a user.

11. The test and measurement system according to claim 10, wherein the instructions comprise an indication of an area to be tested or an area to be avoided.

12. The test and measurement system according to claim 10, further comprising an input device, wherein the one or more processors are further configured to make changes to the instructions responsive to input received from the user by way of the input device.

13. The test and measurement system according to claim 1, further comprising an input device, wherein the one or more processors are further configured to make changes to the virtual or augmented content responsive to input received from the user by way of the input device.

14. The test and measurement system according to claim 1, further comprising a gesture capture module configured to detect a gesture performed by a user.

15. The test and measurement system according to claim 14, further comprising a gesture interpretation module configured to recognize the gesture performed by the user and correlate the gesture with a command signal to provide to a test and measurement instrument.

16. A machine-controlled method, comprising:
   receiving augmentation settings for dynamically augmenting a physical testing environment;
   receiving an input feed from the physical testing environment;
   using one or more processors, creating virtual or augmented content based on either or both of the augmentation settings and the input feed; and
   overlaying the virtual or augmented content on an image or video of the physical testing environment to augment a user's view of the physical testing environment.

17. The method of claim 16, wherein receiving the input feed from the physical testing environment comprises receiving multiple input feeds from the physical testing environment.

18. The method of claim 16, wherein the virtual or augmented content comprises:
   content captured by a camera coupled with a measurement probe; or
   a generated waveform related to a device under test in the physical testing environment.

19. The method of claim 16, further comprising:
   detecting a gesture performed by a user.

20. The method of claim 19, further comprising modifying a setting of a test and measurement instrument in the physical testing environment based on the detected gesture.

* * * * *